United States Patent
Ho et al.

(10) Patent No.: US 10,009,016 B1
(45) Date of Patent: Jun. 26, 2018

(54) DYNAMICALLY ADAPTIVE VOLTAGE-FREQUENCY GUARDBAND CONTROL CIRCUIT

(71) Applicant: QUALCOMM Incorporated, San Diego, CA (US)

(72) Inventors: Lam Ho, Austin, TX (US); Keith Alan Bowman, Morrisville, NC (US); Navid Toosizadeh, San Diego, CA (US); Shih-Hsin Jason Hu, San Diego, CA (US); Mohammad Reza Kakoee, San Diego, CA (US); Saravana Krishnan Kannan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days. days.

(21) Appl. No.: 15/393,107

(22) Filed: Dec. 28, 2016

(51) Int. Cl.
| | | |
|---|---|---|
| G01R 31/00 | (2006.01) | |
| G01R 19/00 | (2006.01) | |
| H03K 5/05 | (2006.01) | |
| H03K 5/19 | (2006.01) | |
| H03K 5/00 | (2006.01) | |

(52) U.S. Cl.
CPC ............... *H03K 5/05* (2013.01); *H03K 5/19* (2013.01); *H03K 2005/00019* (2013.01)

(58) Field of Classification Search
CPC ... H03K 5/05; H03K 5/19; H03K 2005/00019
See application file for complete search history.

(56) References Cited

U.S. PATENT DOCUMENTS

| | | | | |
|---|---|---|---|---|
| 6,538,497 B2 * | 3/2003 | Thomas | ................... | H02J 1/10 307/44 |
| 7,355,435 B2 * | 4/2008 | Ferraiolo | ............... | G01R 31/30 257/48 |

(Continued)

OTHER PUBLICATIONS

Bowman K.A., et al., "A 16 nm All-Digital Auto-Calibrating Adaptive Clock Distribution for Supply Voltage Droop Tolerance Across a Wide Operating Range", IEEE Journal of Solid-State Circuits, Jan. 2016, vol. 51, No. 1, pp. 8-17.

(Continued)

Primary Examiner — Kenneth B Wells
(74) Attorney, Agent, or Firm — Loza & Loza, LLP/Qualcomm

(57) ABSTRACT

In certain aspects, a system comprises a voltage-droop mitigation circuit configured to monitor voltage droop in a supply voltage supplied to a circuit, and to perform voltage-droop mitigation for the circuit if the monitored voltage droop is equal to or greater than a droop threshold. In one aspect, the system also includes a performance monitor configured to track a number of clock cycles over which the voltage-droop mitigation circuit performs the voltage-droop mitigation within a time duration, and to adjust the droop threshold based on the number of clock cycles. In another aspect, the system also includes a performance monitor configured to track a number of times that the voltage-droop mitigation circuit performs the voltage-droop mitigation within a time duration, and to adjust the droop threshold based on the number of times that the voltage-droop mitigation circuit performs the voltage-droop mitigation within the time duration.

22 Claims, 18 Drawing Sheets

(56) References Cited

U.S. PATENT DOCUMENTS

| | | | |
|---|---|---|---|
| 7,467,050 B2 * | 12/2008 | Douriet | G06F 1/305 |
| | | | 702/193 |
| 7,720,621 B2 * | 5/2010 | Weekly | G06F 1/3203 |
| | | | 324/762.06 |
| 8,648,645 B2 * | 2/2014 | Konstadinidis | H02M 3/157 |
| | | | 327/534 |
| 9,092,210 B2 | 7/2015 | Rotem et al. | |
| 9,413,344 B2 | 8/2016 | Bowman et al. | |
| 9,483,098 B2 * | 11/2016 | Bridges | G06F 1/305 |
| 2004/0119521 A1 | 6/2004 | Kurd et al. | |
| 2011/0241423 A1 | 10/2011 | Bridges et al. | |
| 2012/0187991 A1 | 7/2012 | Sathe et al. | |
| 2015/0378412 A1 | 12/2015 | Suryanarayanan et al. | |

OTHER PUBLICATIONS

International Search Report and Written Opinion—PCT/US2017/065558—ISA/EPO—dated Feb. 28, 2018.

* cited by examiner

DYNAMICALLY ADAPTIVE VOLTAGE-FREQUENCY GUARDBAND CONTROL CIRCUIT

BACKGROUND

Field

Aspects of the present disclosure relate generally to voltage droop, and more particularly, to voltage droop mitigation.

Background

A circuit (e.g., processor) on a chip receives power from a voltage source via a power distribution network (PDN). Abrupt changes in the activity of the circuit may induce large current transients in the PDN. The large current transients cause droops in the supply voltage. If the magnitude of a voltage droop is large enough to cause the supply voltage to drop below a minimum supply voltage required for proper operation of the circuit, then the circuit may malfunction (e.g., timing violations may occur in critical paths of the circuit).

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

A first aspect relates to a system. The system includes a voltage-droop mitigation circuit configured to monitor voltage droop in a supply voltage supplied to a circuit, and to perform voltage-droop mitigation for the circuit if the monitored voltage droop is equal to or greater than a droop threshold. The system also includes a performance monitor configured to track a number of clock cycles over which the voltage-droop mitigation circuit performs the voltage-droop mitigation within a time duration, and to adjust the droop threshold based on the number of clock cycles.

A second aspect relates to a method for adjusting a droop threshold. The method includes monitoring voltage droop in a supply voltage supplied to a circuit, and performing voltage-droop mitigation for the circuit if the monitored voltage droop is equal to or greater than the droop threshold. The method also includes tracking a number of clock cycles over which the voltage-droop mitigation is performed within a time duration, and adjusting the droop threshold based on the number of clock cycles.

A third aspect relates to a system. The system includes a voltage-droop mitigation circuit configured to monitor voltage droop in a supply voltage supplied to a circuit, and to perform voltage-droop mitigation for the circuit if the monitored voltage droop is equal to or greater than a droop threshold. The system also includes a performance monitor configured to track a number of times that the voltage-droop mitigation circuit performs the voltage-droop mitigation within a time duration, and to adjust the droop threshold based on the number of times that the voltage-droop mitigation circuit performs the voltage-droop mitigation within the time duration.

A fourth aspect relates to a method. The method includes monitoring voltage droop in a supply voltage supplied to a circuit, and performing voltage-droop mitigation for the circuit if the monitored voltage droop is equal to or greater than the droop threshold. The method also includes tracking a number of times that the voltage-droop mitigation is performed within a time duration, and adjusting the droop threshold based on the number of times that the voltage-droop mitigation is performed within the time duration.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the described embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
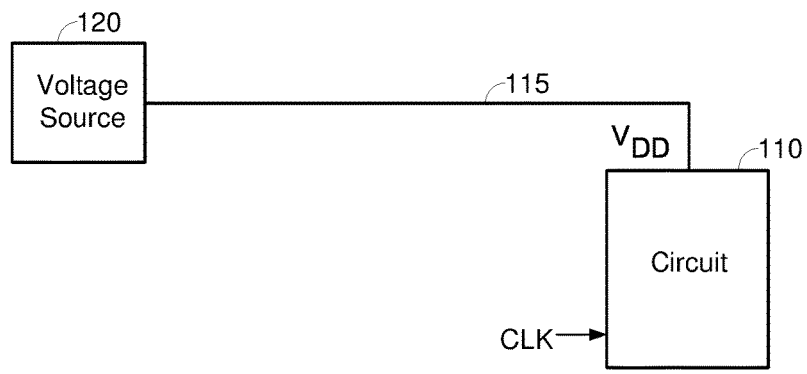
FIG. 1 shows an example of a circuit that receives a supply voltage from a voltage source via a power distribution network (PDN).

FIG. 1 shows an example of a circuit 110 (e.g., processor) that receives power from a voltage source 120 via a power distribution network (PDN) 115. The voltage source 120 may include a power management integrated circuit (PMIC) configured to generate a supply voltage $V_{DD}$, which is supplied to the circuit 110 via the PDN 115. In this regard, the PMIC may include a voltage regulator (switching regulator) configured to convert an input voltage (e.g., from a battery or another source) into the supply voltage $V_{DD}$. The circuit 110 receives a clock signal (denoted "CLK") for timing operations of the circuit 110. Typically, the circuit 110 requires a minimum supply voltage to operate properly at a certain clock frequency. For example, the circuit 110 may require a minimum supply voltage in order for critical paths in the circuit 110 to meet certain timing requirements (e.g., setup times) for proper operation.

Abrupt changes in the activity of the circuit 110 (e.g., processor) may induce large current transients in the PDN 115. The large current transients cause droops in the supply voltage $V_{DD}$. This is because the voltage source 120 (e.g., PMIC) is not able to instantaneously respond to a large current transient due to inductances in the PDN 115. As a result, the current transient discharges capacitors in the PDN 115 (e.g., decoupling capacitors) and/or capacitors in other circuits coupled to the PDN 115, causing a droop in the supply voltage $V_{DD}$.

Figure 2:
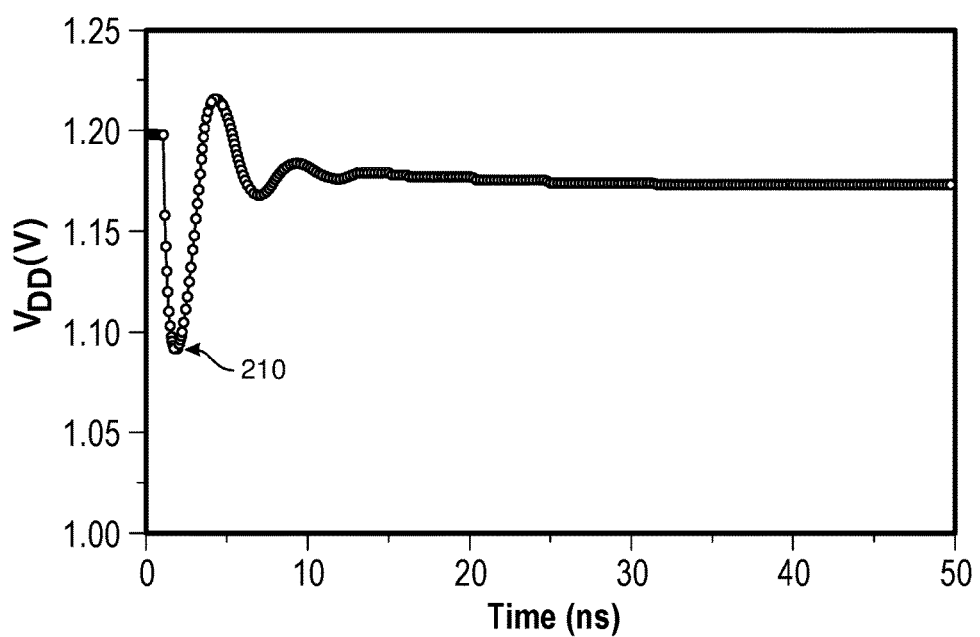
FIG. 2 shows an example of voltage droop in a supply voltage.

In this regard, FIG. 2 shows an example of a droop 210 in the supply voltage $V_{DD}$ caused by a large current transient. If the magnitude of the voltage droop 210 is large enough to cause the supply voltage $V_{DD}$ to drop below the minimum supply voltage required for proper operation of the circuit 110, then the circuit 110 may malfunction (e.g., timing violations may occur in critical paths of the circuit 110).

Figure 3:
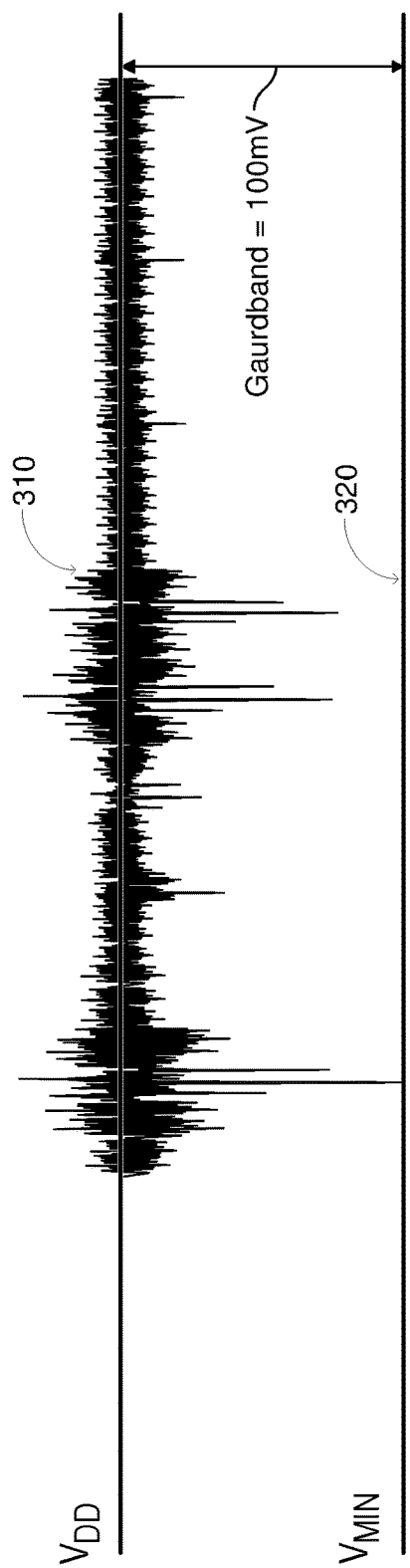
FIG. 3 shows an example of a guardband built into a supply voltage to account for worst-case voltage droop.

To address this, a guardband (voltage margin) is typically built into the supply voltage $V_{DD}$. The guardband is an amount by which the supply voltage $V_{DD}$ is raised above the minimum voltage to accommodate voltage droop. FIG. 3 shows an example of a supply voltage $V_{DD}$ with a guardband of about 100 mV. In FIG. 3, the voltage waveform 310 shows fluctuations of the supply voltage about the desired supply voltage level (also referred to as the target supply voltage), and line 320 shows the minimum voltage (denoted "$V_{MIN}$") required for proper operation of the circuit 110 at a target clock frequency. In this example, the guardband is based on a worst-case voltage droop so that supply voltage $V_{DD}$ does not drop below the minimum voltage $V_{MIN}$ for the worst-case voltage droop. A drawback of this approach is that the supply voltage $V_{DD}$ needs to be increased to add the guardband, which increases power consumption of the circuit 110.

Figure 4:
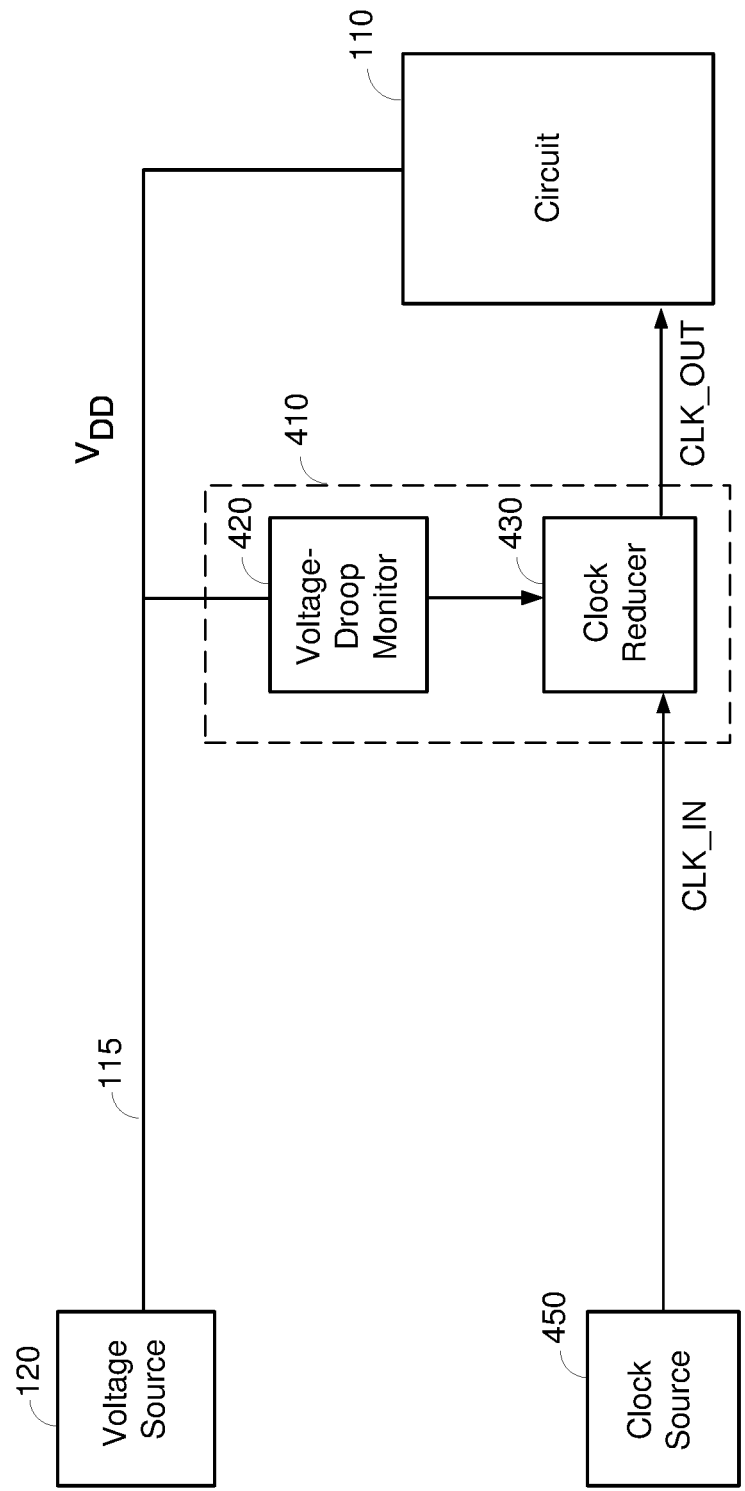
FIG. 4 shows an example of a voltage-droop mitigation circuit according to certain aspects of the present disclosure.

The guardband may be reduced using voltage-droop mitigation. In this regard, FIG. 4 shows an example of a voltage-droop mitigation circuit 410. The voltage-droop mitigation circuit 410 includes a voltage-droop monitor 420 and a clock reducer 430. The voltage-droop monitor 410 may be configured to monitor the supply voltage $V_{DD}$ for voltage droop, as discussed further below. The clock reducer 430 receives an input clock signal (denoted "CLK_IN") from a clock source 450, and outputs an output clock signal (denoted "CLK_OUT") to the circuit 110 for timing operations of the circuit 110. The clock reducer 430 is configured to operate in one of two modes under the control of the voltage droop monitor 420. In the first mode, the clock reducer 430 is configured to pass the input clock signal CLK_IN to the circuit 110 as the output clock signal CLK_OUT. In the second mode, the clock reducer 430 is configured to reduce the frequency of the input clock signal CLK_IN to produce a reduced-frequency clock signal and output the reduced-frequency clock signal to the circuit 110 as the output clock signal CLK_OUT.

In this example, the voltage-droop monitor 420 monitors voltage droop in the supply voltage and compares the monitored voltage droop with a droop threshold. The voltage droop may be an amount by which the supply voltage drops below the target supply voltage (i.e., supply voltage without droop). For example, if the target supply voltage is 900 mV and the supply voltage drops to 870 mV, then the voltage droop is about 30 mV.

If the voltage droop is below the droop threshold (e.g., 50 mV), then the voltage-droop monitor 420 does not respond to the droop. In this case, the clock reducer 430 operates in the first mode and passes the input clock signal CLK_IN to the circuit 110 as the output clock signal CLK_OUT. The circuit 110 (e.g., processor) runs at the target clock frequency (e.g., 2 GHz), which corresponds to the frequency of the input clock signal CLK_IN.

If the monitored voltage droop is equal to or greater than the droop threshold, then the voltage-droop monitor 420 instructs the clock reducer 430 to operate in the second mode, in which the clock reducer 430 reduces the frequency of the input clock signal CLK_IN and outputs the resulting reduced-frequency clock signal to the circuit 110. For example, the clock reducer 430 may reduce the clock frequency by 50% (e.g., reduce the clock frequency from 2 GHz to 1 GHz). The reduction in the clock frequency prevents the voltage droop from causing the circuit 110 to malfunction (e.g., prevents timing violations in critical paths of the circuit 110). This is because the timing requirements for critical paths of the circuit 110 are relaxed at the reduced clock frequency, allowing the circuit 110 to tolerate a larger voltage droop at the reduced clock frequency.

When the supply voltage recovers from the droop (the monitored voltage droop drops below the droop threshold), the voltage-droop monitor 420 may instruct the clock reducer 430 to switch back to operation in the first mode, in which the clock reducer 430 passes the input clock signal CLK_IN to the circuit 110. This restores the clock frequency at the circuit 110 back to the target clock frequency (i.e., frequency of the input clock signal CLK_IN).

The voltage-droop mitigation circuit 410 allows the guardband to be reduced, and therefore the supply voltage $V_{DD}$ to be reduced to reduce power consumption. This is because the voltage-droop mitigation circuit 410 initiates (triggers) droop mitigation (i.e., reduces the clock frequency at the circuit 110) before the supply voltage drops below the minimum voltage required for proper operation at the target clock frequency (e.g., 2 GHz). As a result, the guardband is no longer required to be large enough to always keep the supply voltage from crossing the minimum voltage.

Figure 5:
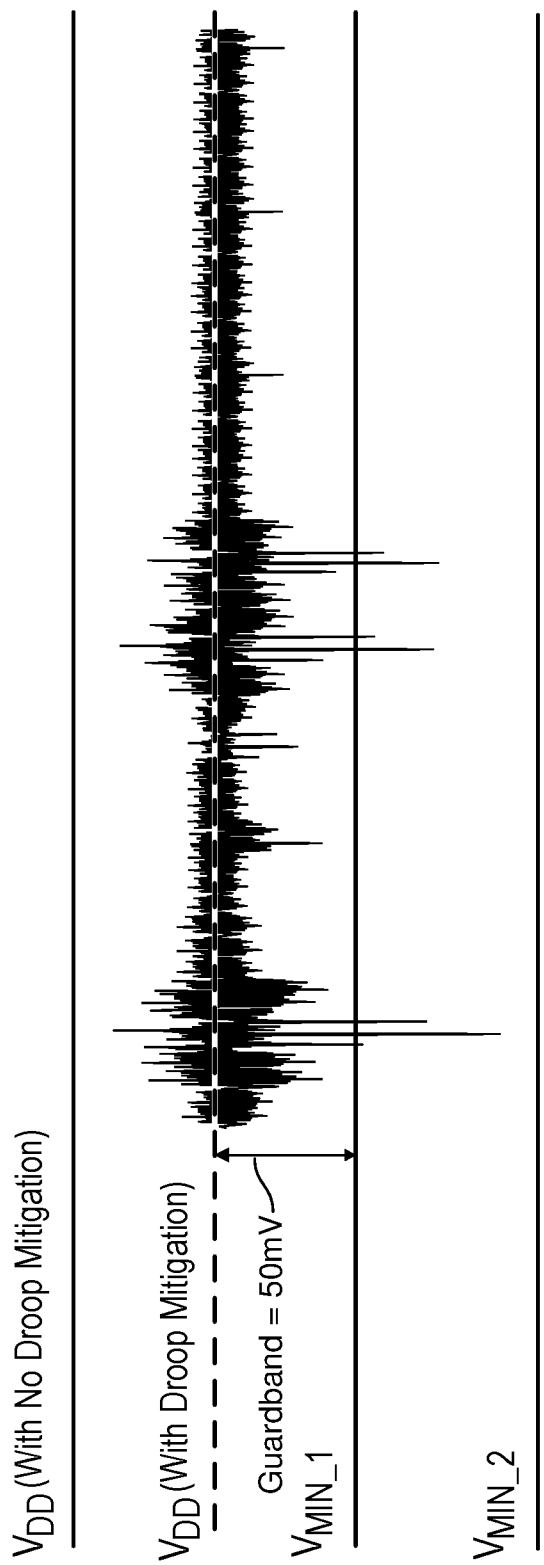
FIG. 5 shows an example of a reduction in the guardband provided by using the voltage-droop mitigation circuit according to certain aspects of the present disclosure.

In this regard, FIG. 5 shows an example in which the guardband is reduced to 50 mV. In this example, there are two minimum voltages $V_{MIN\_1}$ and $V_{MIN\_2}$. The first minimum voltage $V_{MIN\_1}$ is the minimum voltage required for the circuit 110 to properly operate at the target clock frequency (e.g., 2 GHz). The first minimum voltage $V_{MIN\_1}$ is the same as the minimum voltage $V_{MIN}$ shown in FIG. 3. The second minimum voltage $V_{MIN\_2}$ is the minimum voltage required for the circuit 110 to properly operate at the reduced clock frequency (e.g., 1 GHz). As shown in FIG. 5, the second minimum voltage $V_{MIN\_2}$ is lower than the first minimum voltage $V_{MIN\_1}$. In this example, the droop threshold may be set such that the voltage-droop mitigation circuit 410 initiates (triggers) droop mitigation when the supply voltage drops to the first minimum voltage $V_{MIN\_1}$. In this case, the voltage-droop mitigation circuit 410 initiates droop mitigation each time the supply voltage crosses the first minimum voltage $V_{MIN\_1}$. In the example shown in FIG. 5, the supply voltage 510 crosses the first minimum voltage $V_{MIN\_1}$ several times during the period of time shown in FIG. 5, and therefore performs voltage-droop mitigation several times during the period of time shown in FIG. 5.

There is a tradeoff between power and performance. Reducing the droop threshold allows the supply voltage to be moved closer to the minimum voltage for the target clock frequency, and hence the supply voltage to be reduced. The reduction in the supply voltage reduces power consumption.

However, reducing the droop threshold causes the voltage-droop mitigation circuit 410 to initiate droop mitigation for smaller voltage droops, and therefore to initiate droop mitigation more frequently (more often). A problem with this is that the performance of the circuit 110 is reduced each time droop mitigation is performed due to the reduction in the clock frequency at the circuit 110.

Therefore, it may be desirable to set the droop threshold at a value that provides an optimal tradeoff between power and performance. For example, an optimal droop threshold may be defined as a droop threshold that results in voltage-droop mitigation being performed a certain percent of the time (e.g., 0.1 percent of the time).

In current systems, the droop threshold is static (fixed) during operation of the circuit 110. A problem with this is that the magnitude and/or frequency of voltage droops in the supply voltage may vary for different workloads of the circuit 110 (e.g., processor). As a result, an optimal droop threshold for one workload is generally not optimal for another workload. Typically, the droop threshold is set based on the worst-case workload of the circuit 110. Thus, the droop threshold is typically not optimal for most workloads of the circuit 110.

Embodiments of the present disclosure address the above problem by providing a performance monitor that dynamically adjusts (adapts) the droop threshold to changes in the workload of the circuit 110 (e.g., processor), as discussed further below.

Figure 6:
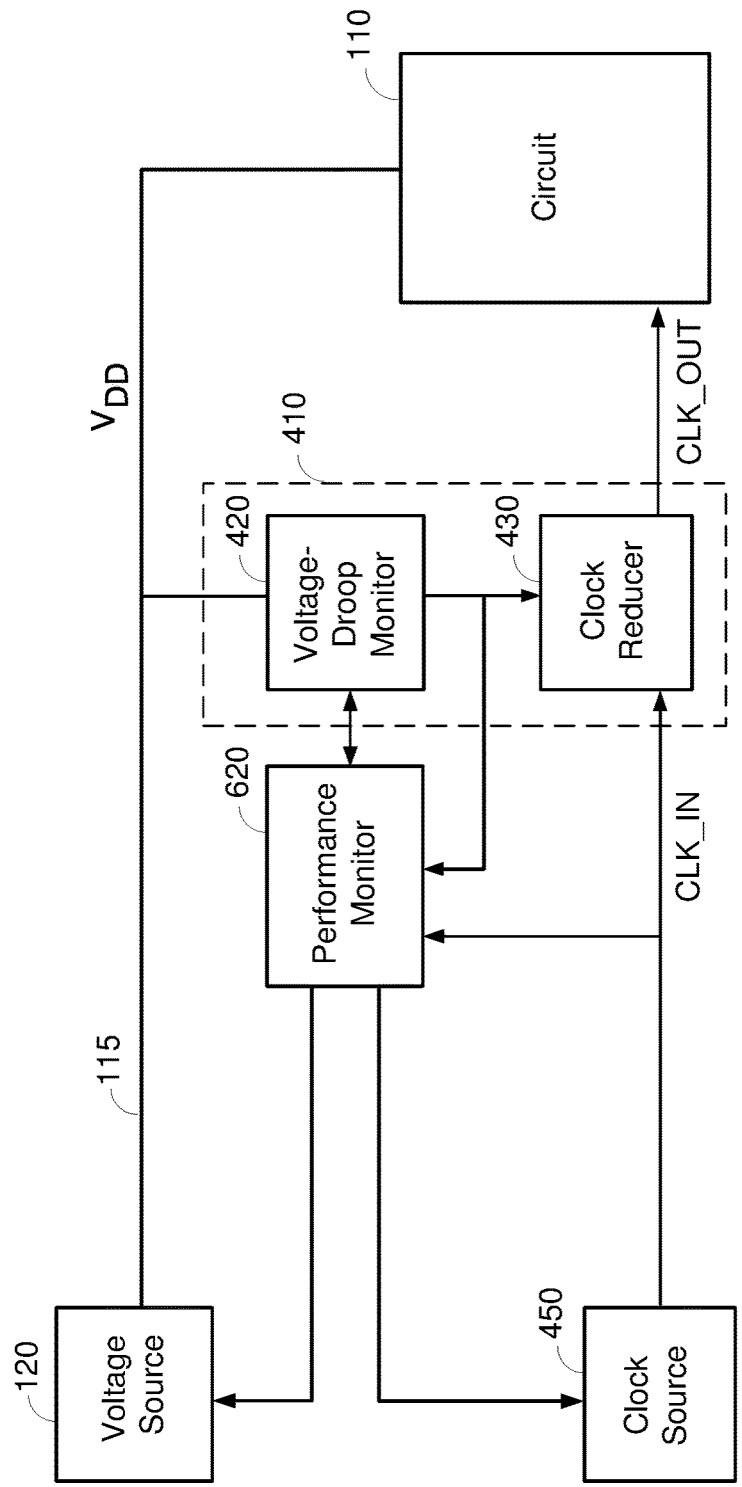
FIG. 6 shows another example of a performance monitor according to certain aspects of the present disclosure.

FIG. 6 shows an example of a performance monitor 620 configured to dynamically adjusting the droop threshold used by the voltage-droop monitor 420, as discussed further below.

The voltage-droop monitor 420 monitors voltage droop in the supply voltage and compares the monitored voltage droop with the droop threshold. If the monitored voltage droop is below the droop threshold, then the voltage-droop monitor 420 does not respond to the droop. In this case, the clock reducer 430 operates in the first mode, in which the clock reducer 430 passes the input clock signal CLK_IN to the circuit 110. If the monitored voltage droop is equal to or greater than the droop threshold, then the voltage-droop monitor 420 instructs the clock reducer 430 to operate in the second mode to reduce the clock frequency at the circuit 110, as discussed above. As discussed further below, the voltage-droop monitor 420 may detect voltage droop using voltage-based droop detection or timing-based droop detection.

The performance monitor 620 tracks a number of clock cycles (periods) of the input clock signal CLK_IN over which droop mitigation is performed (i.e., the clock frequency is reduced). For example, the voltage droop monitor 420 may output a first logic value (e.g., zero) to the clock reducer 430 to instruct the clock reducer 430 to operate in the first mode, and output a second logic value (e.g., one) to the clock reducer 430 to instruct the clock reducer 430 to operate in the second mode. In this example, the performance monitor 620 may track the number of clock cycles over which droop mitigation is performed by tracking the number of clock cycles over which the voltage-droop monitor 420 outputs the second logic value (e.g., one) to the clock reducer 430.

In one example, the performance monitor 620 may track the number of clock cycles over which droop mitigation is performed within a time duration (time window). It is to be appreciated that the clock cycles over which droop mitigation is performed typically include non-consecutive clock cycles assuming droop mitigation is performed more than once within the time duration. The performance monitor 620 may track the number of clock cycles over which droop mitigation is performed by incrementing the count value of a counter for each clock cycle during which droop mitigation is performed (e.g., each clock cycle during which the voltage-droop monitor 420 outputs the second logic value to the clock reducer 430). In this example, the performance monitor 620 may periodically reset the counter (e.g., at the end of the time duration). The performance monitor may also reset the counter when the droop threshold is changed.

The performance monitor 620 may then determine whether the droop threshold needs to be adjusted based on the number of clock cycles over which droop mitigation is performed. For example, if the number of clock cycles over which droop mitigation is performed is low (e.g., equal to or below a first threshold number), then the performance monitor 620 may determine that the droop threshold can be reduced. In this case, the performance monitor 620 decreases the droop threshold (e.g., by a predetermined step). The performance monitor 620 may also instruct the voltage source 120 (e.g., PMIC) to reduce the supply voltage $V_{DD}$, which reduces the guardband and power consumption.

If the number of clock cycles over which droop mitigation is performed is high (e.g., equal to or above a second threshold number), then the performance monitor 620 may determine that the droop threshold is too low (e.g., droop mitigation is being performed too frequently (too often) and negatively impacting performance of the circuit 110). In this case, the performance monitor 620 increases the droop threshold (e.g., by a predetermined step). The performance monitor 620 may also instruct the voltage source 120 to increase the supply voltage $V_{DD}$, which increases the guardband.

If the number of clock cycles over which droop mitigation is performed is within a certain range (e.g., between the first threshold number and the second threshold number), then the performance monitor 620 may leave the current droop threshold alone.

The performance monitor 620 dynamically adjusts the droop threshold in response to changes in the workload of the circuit 110 (e.g., processor). This is because, when a change in the workload increases the magnitude and/or frequency of voltage droops such that the number of clock cycles over which droop mitigation is performed becomes high (e.g., equal to or above the second threshold number), the performance monitor 620 increases the droop threshold. When a change in the workload decreases the magnitude and/or frequency of voltage droops such that the number of clock cycles over which droop mitigation is performed becomes low (e.g., equal to or below the first threshold number), the performance monitor 620 decreases the droop threshold.

In the above example, the performance monitor 620 tracks the number of cycles of the input clock signal CLK_IN over which droop mitigation is performed. However, it is to be appreciated that the present disclosure is not limited to this example. For instance, the performance monitor 620 may track the number of clock cycles of the reduced-frequency clock signal over which droop mitigation is performed, or track the number of clock cycles of another clock signal over which droop mitigation is performed.

In another example, the performance monitor 620 may track the number of times that droop mitigation is performed (triggered or initiated) within a time duration. In this example, the performance monitor 620 may track the number of times droop mitigation is performed by incrementing the count value of a counter each time droop mitigation is performed (e.g., each time the output of the droop monitor 420 switches from the first logic value to the second logic value). In this example, the performance monitor 620 may decrease the droop threshold if the number of times that droop mitigation is performed is low (e.g., equal to or below a first threshold number), and increase the droop threshold if the number of times that droop mitigation is performed is high (e.g., equal to or above a second threshold number). The first and second threshold numbers in this example may differ from the first and second threshold numbers in the previous example, in which the number of clock cycles over which droop mitigation is performed is tracked. The performance monitor 620 may leave the droop threshold alone if the number of times that droop mitigation is performed is within a certain range (e.g., between the first threshold number and second threshold number).

The voltage source 120 may include a power management integrated circuit (PMIC) configured to set the supply voltage $V_{DD}$ to any one of a plurality of different supply voltage levels. In this example, the performance monitor 620 may increase the supply voltage $V_{DD}$ by sending an instruction (e.g., a request) to the voltage source 120 to set the supply voltage level of the supply voltage $V_{DD}$ to one of the plurality of supply voltage levels that is higher than the current supply voltage level. The performance monitor 620 may decrease the supply voltage $V_{DD}$ by sending an instruction (e.g., a request) to the voltage source 120 to set the supply voltage level of the supply voltage $V_{DD}$ to one of the plurality of supply voltage levels that is lower than the current supply voltage level.

Figure 7A:
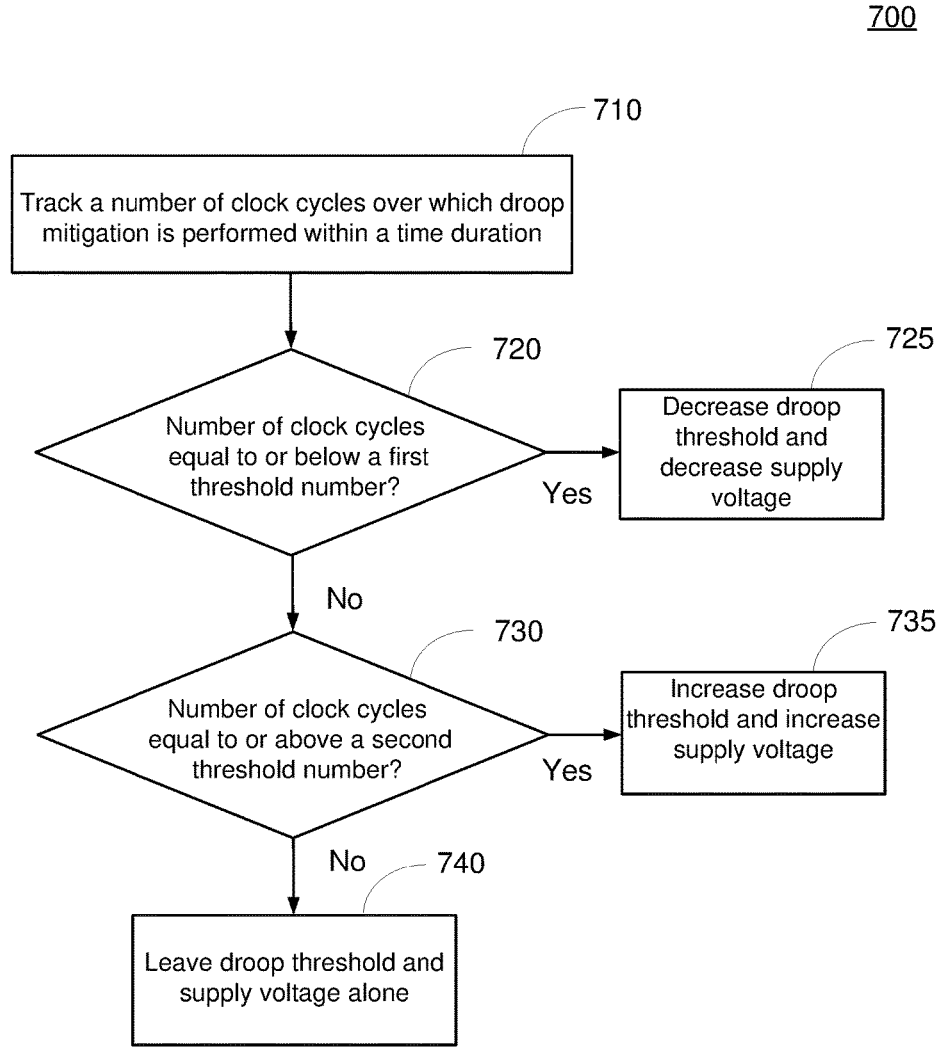
FIG. 7A is a flowchart showing an exemplary method for adjusting a droop threshold according to certain aspects of the present disclosure.

FIG. 7A is a flowchart illustrating a method 700 for adjusting the droop threshold according to certain aspects. The method 700 may be performed by the performance monitor 620.

At step 710, the performance monitor 620 tracks a number of clock cycles over which droop mitigation is performed within a time duration. The clock cycles may be clock cycles of the input clock signal CLK_IN, clock cycles of the reduced-frequency clock signal, or clock cycles of another clock signal.

At step 720, the performance monitor 620 determines whether the number of clock cycles is equal to or below a first threshold number. If the number of clock cycles is equal to or below the first threshold number, then the performance monitor 620 decreases the droop threshold and decreases the supply voltage $V_{DD}$ in step 725.

At step 730, the performance monitor 620 determines whether the number of clock cycles is equal to or above a second threshold number. The second threshold number may be greater than the first threshold number. If the number of clock cycles is equal to or above the second threshold number, then the performance monitor 620 increases the droop threshold and increases the supply voltage $V_{DD}$ in step 735.

At step 740, the performance monitor 620 leaves the droop threshold and supply voltage alone if neither of the conditions in steps 720 and 730 are met (i.e., the number of clock cycles is between the first and second threshold numbers). It is to be appreciated that the performance monitor 620 is not limited to performing the steps in the exemplary order shown in FIG. 7A, and may perform the steps in a different order.

Figure 7B:
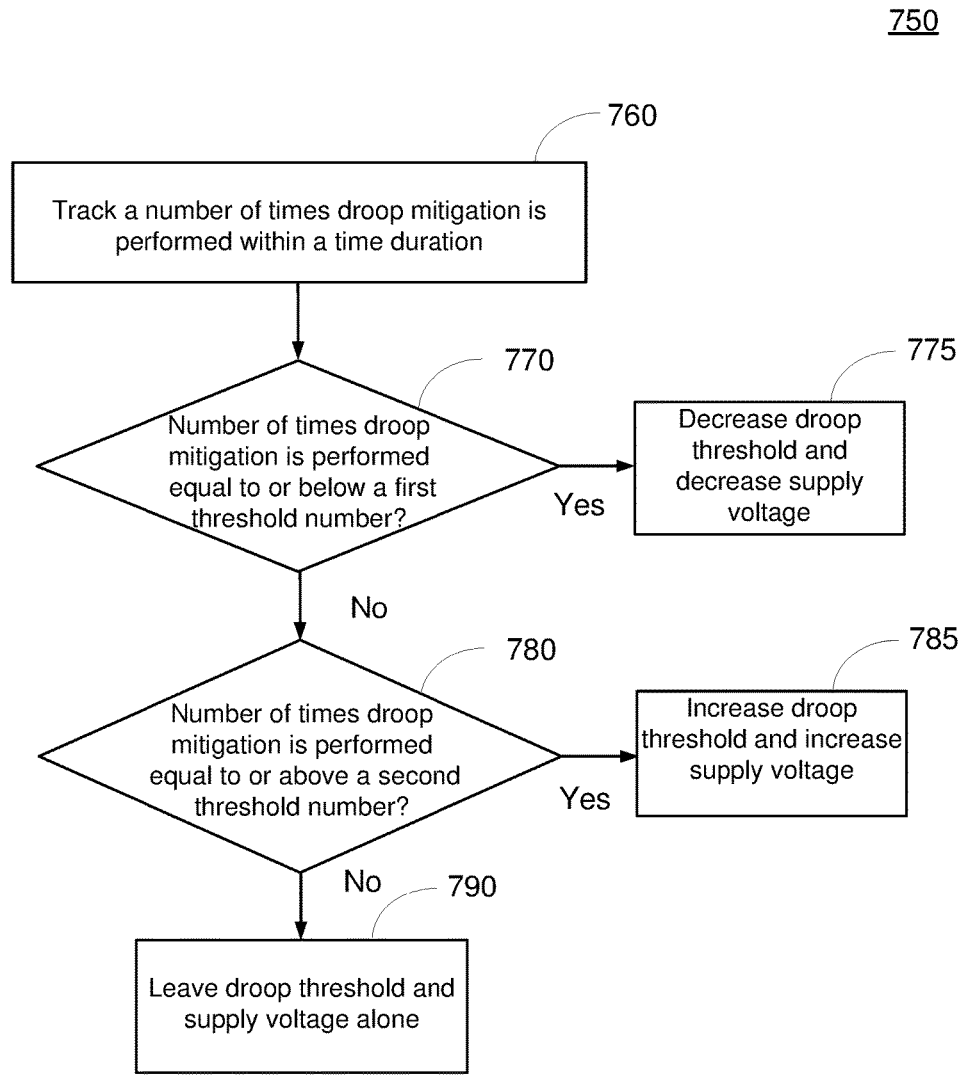
FIG. 7B is a flowchart showing another exemplary method for adjusting a droop threshold according to certain aspects of the present disclosure.

FIG. 7B is a flowchart illustrating a method 750 for adjusting the droop threshold according to certain aspects. The method 750 may be performed by the performance monitor 620.

At step 760, the performance monitor 620 tracks a number of times that droop mitigation is performed within a time duration. For example, the performance monitor 620 may track the number of times that droop mitigation is performed by incrementing a counter each time droop mitigation is triggered.

At step 770, the performance monitor 620 determines whether the number of times that droop mitigation is performed is equal to or below a first threshold number. If the number of times droop mitigation is performed is equal to or below the first threshold number, then the performance monitor 620 decreases the droop threshold and decreases the supply voltage $V_{DD}$ in step 775.

At step 780, the performance monitor 620 determines whether the number of times droop mitigation is performed is equal to or above a second threshold number. The second threshold number may be greater than the first threshold number. If the number of times that droop mitigation is performed is equal to or above the second threshold number, then the performance monitor 620 increases the droop threshold and increases the supply voltage $V_{DD}$ in step 785.

At step 790, the performance monitor 620 leaves the droop threshold and supply voltage alone if neither of the conditions in steps 770 and 780 are met (i.e., the number of times that droop mitigation is performed is between the first and second threshold numbers). It is to be appreciated that the performance monitor 620 is not limited to performing the steps in the exemplary order shown in FIG. 7B, and may perform the steps in a different order.

Figure 8:
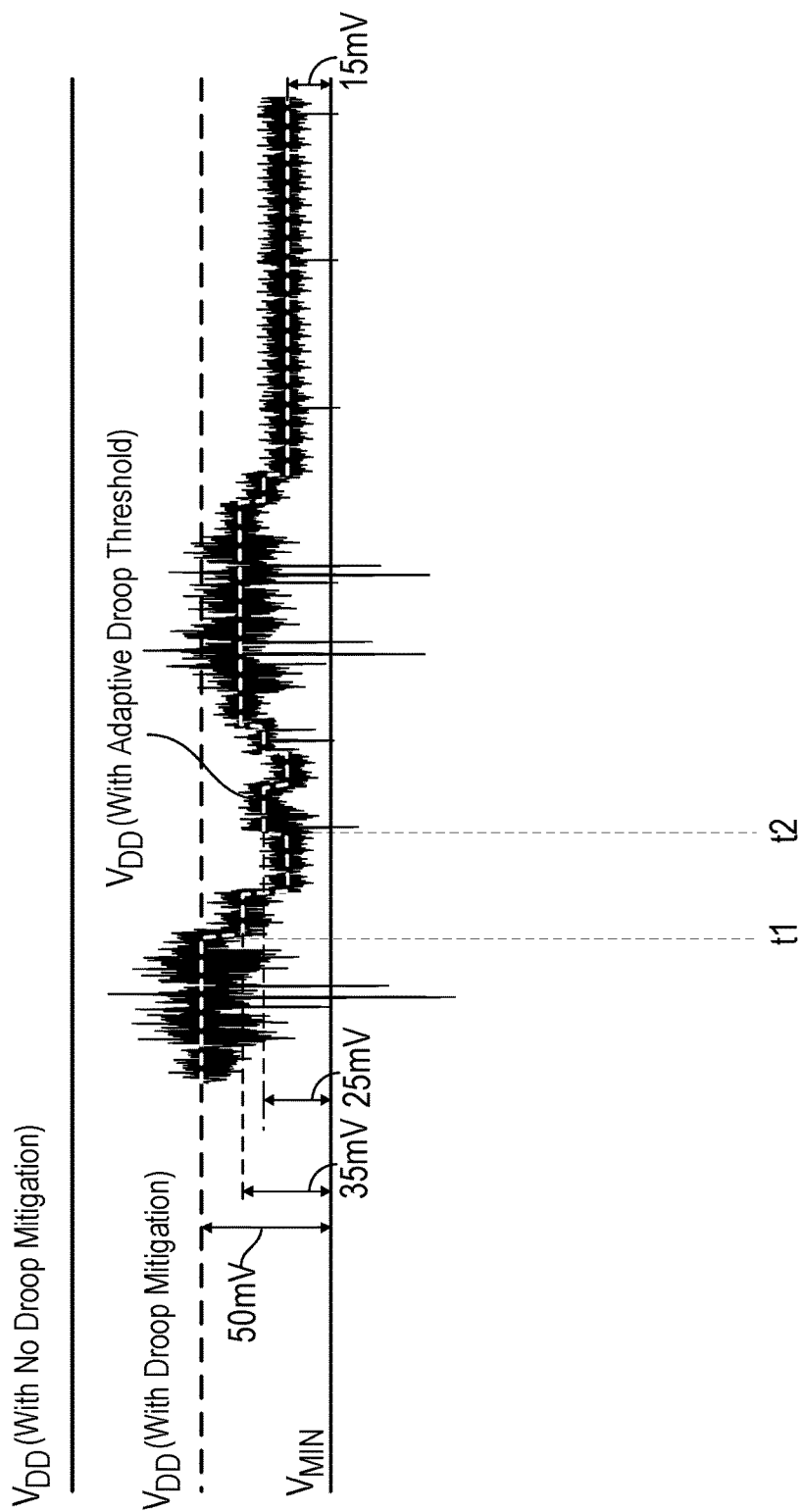
FIG. 8 shows an example in which the supply voltage and guardband are adjusted with adjustments in the droop threshold according to certain aspects of the present disclosure.

FIG. 8 shows an example in which the droop threshold is adjusted according to aspects of the present disclosure. Each time the droop threshold is adjusted in this example, the performance monitor 620 also adjusts the supply voltage $V_{DD}$. For example, at time t1, the performance monitor 620 decreases the droop threshold and decreases the supply voltage $V_{DD}$. The guardband decreases from 50 mV to 35 mV. At time t2, the performance monitor 620 increases the droop threshold and increases the supply voltage $V_{DD}$. The guardband increases from 15 mV to 25 mV.

In the above example, when the droop threshold is decreased, the performance monitor 620 also decreases the supply voltage $V_{DD}$, and, when the droop threshold is increased, the performance monitor 620 also increases the supply voltage $V_{DD}$.

In another example, when the droop threshold is decreased, the performance monitor 620 may leave the supply voltage $V_{DD}$ alone and increase the frequency of the input clock signal CLK_IN (i.e., target clock frequency) instead. Increasing the frequency of the input clock signal CLK_IN increases performance of the circuit 110 (e.g., processor) during normal operation. Increasing the frequency of the input clock signal CLK_IN also reduces the guardband by increasing the minimum voltage needed for operation of the circuit 110 (e.g., minimum voltage needed for critical paths of the circuit 110 to meet timing requirements).

In this example, when the droop threshold is increased, the performance monitor 620 may leave the supply voltage $V_{DD}$ alone and decrease the frequency of the input clock signal CLK_IN (i.e., target clock frequency) instead. Decreasing the frequency of the input clock signal CLK_IN increases the guardband by decreasing the minimum voltage needed for operation of the circuit 110 (e.g., minimum voltage needed for critical paths in the circuit 110 to meet timing requirements). This is because the decrease in the frequency of the input clock signal CLK_IN relaxes timing requirements of critical paths of the circuit 110.

The clock source 450 may be configured to generate any one of a plurality of different clock frequencies from a reference clock frequency (e.g., using one or more phase locked loops (PLLs)). In this example, the performance monitor 620 may increase the frequency of the input clock signal CLK_IN by sending an instruction (e.g., a request) to the clock source 450 to set the clock frequency of the input clock signal CLK_IN to one of the plurality of clock frequencies that is higher than the current clock frequency. The performance monitor 620 may decrease the clock frequency of the input clock signal CLK_IN by sending an instruction (e.g., a request) to the clock source 450 to set the clock frequency of the input clock signal CLK_IN to one of the plurality of clock frequencies that is lower than the current clock frequency.

Figure 9A:
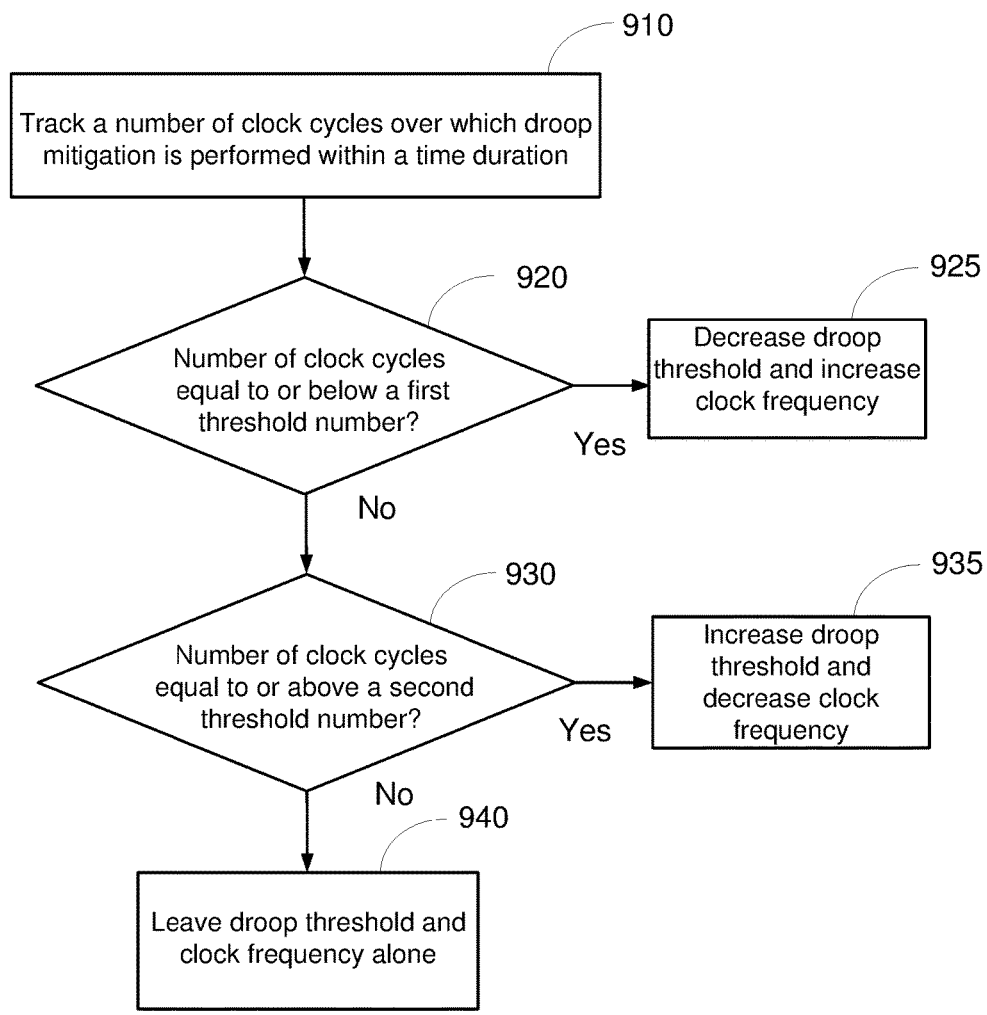
FIG. 9A is a flowchart showing still another exemplary method for adjusting a droop threshold according to certain aspects of the present disclosure.

FIG. 9A is a flowchart illustrating a method 900 for adjusting the droop threshold according to certain aspects. The method 900 may be performed by the performance monitor 620.

At step 910, the performance monitor 620 tracks a number of clock cycles over which droop mitigation is performed within a time duration. Step 910 may be the same as step 710 discussed above with reference to FIG. 7A.

At step 920, the performance monitor 620 determines whether the number of clock cycles is equal to or below a first threshold number. If the number of clock cycles is equal to or below the first threshold number, then the performance monitor 620 decreases the droop threshold and increases the frequency of the input clock signal CLK_IN (increases the target clock frequency) in step 925.

At step 930, the performance monitor 620 determines whether the number of clock cycles is equal to or above a second threshold number. The second threshold number may be greater than the first threshold number. If the number of clock cycles is equal to or above the second threshold number, then the performance monitor 620 increases the droop threshold and decreases the frequency of the input clock signal CLK_IN (decreases the target clock frequency) in step 935.

At step 940, the performance monitor 620 leaves the droop threshold and clock frequency alone if neither of the conditions in steps 920 and 930 are met (i.e., the number of clock cycles is between the first and second threshold numbers). It is to be appreciated that the performance monitor 620 is not limited to performing the steps in the exemplary order shown in FIG. 9A, and may perform the steps in a different order.

Figure 9B:
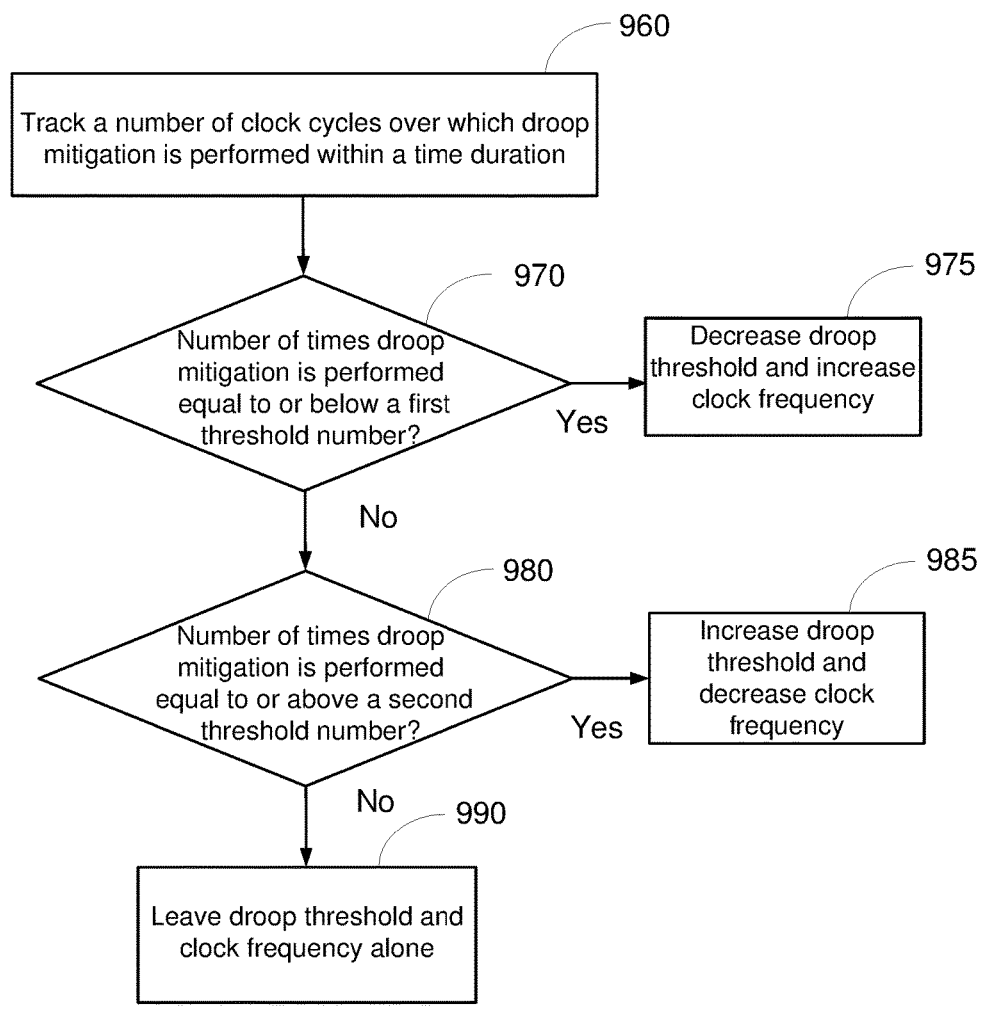
FIG. 9B is a flowchart showing yet another exemplary method for adjusting a droop threshold according to certain aspects of the present disclosure.

FIG. 9B is a flowchart illustrating a method 950 for adjusting the droop threshold according to certain aspects. The method 950 may be performed by the performance monitor 620.

At step 960, the performance monitor 620 tracks a number of times that droop mitigation is performed within a time duration. Step 960 may be the same as step 760 discussed above with reference to FIG. 7B.

At step 970, the performance monitor 620 determines whether the number of times that droop mitigation is performed is equal to or below a first threshold number. If the number of times that droop mitigation is performed is equal to or below the first threshold number, then the performance monitor 620 decreases the droop threshold and increases the frequency of the input clock signal CLK_IN (increases the target clock frequency) in step 975.

At step 980, the performance monitor 620 determines whether the number of times that droop mitigation is performed is equal to or above a second threshold number. The second threshold number may be greater than the first threshold number. If the number of times that droop mitigation is performed is equal to or above the second threshold number, then the performance monitor 620 increases the droop threshold and decreases the frequency of the input clock signal CLK_IN (decreases the target clock frequency) in step 985.

At step 990, the performance monitor 620 leaves the droop threshold and clock frequency alone if neither of the conditions in steps 970 and 980 are met (i.e., the number of times droop mitigation is performed is between the first and second threshold numbers). It is to be appreciated that the performance monitor 620 is not limited to performing the steps in the exemplary order shown in FIG. 9B, and may perform the steps in a different order.

It is to be appreciated that the present disclosure is not limited to the examples discussed above. For example, when the droop threshold is decreased, the performance monitor 620 may both decrease the supply voltage $V_{DD}$ and increase the clock frequency of the input clock signal CLK_IN. When the droop threshold is increased, the performance monitor 620 may both increase the supply voltage $V_{DD}$ and decrease the clock frequency of the input clock signal CLK_IN.

In one example, there may be a maximum supply voltage level for the circuit 110. The maximum supply voltage level may be the maximum supply voltage level at which the voltage source and/or performance monitor is configured to set the supply voltage $V_{DD}$. In this example, when the droop threshold is increased, the performance monitor 620 may either increase the supply voltage $V_{DD}$ or decrease the frequency of the input clock signal CLK_IN depending on whether the current supply voltage level is at the maximum supply voltage level. If the current supply voltage level is below the maximum supply voltage level, then the performance monitor 620 increases the supply voltage $V_{DD}$. If the current supply voltage level is already at the maximum supply voltage level, then the performance monitor 620 decreases the frequency of the input clock signal CLK_IN.

In another example, there may be a minimum supply voltage level for the circuit 110. The minimum supply voltage level may be the minimum supply voltage level at which the voltage source and/or performance monitor is configured to set the supply voltage $V_{DD}$. In this example, when the droop threshold is decreased, the performance monitor 620 may either decrease the supply voltage $V_{DD}$ or increase the clock frequency of the input clock signal CLK_IN depending on whether the current supply voltage level is at the minimum supply voltage level. If the current supply voltage level is above the minimum supply voltage level, then the performance monitor 620 decreases the supply voltage $V_{DD}$. If the current supply voltage level is already at the minimum supply voltage level, then the performance monitor 620 increases the frequency of the input clock signal CLK_IN.

In another example, there may be a minimum clock frequency for the circuit 110. The minimum clock frequency may be the minimum clock frequency at which the clock source and/or performance monitor is configured to set for the input clock signal. In this example, when the droop threshold is increased, the performance monitor 620 may either increase the supply voltage $V_{DD}$ or decrease the frequency of the input clock signal CLK_IN depending on whether the frequency of the input clock signal CLK_IN is at the minimum clock frequency. If the clock frequency of the input clock signal CLK_IN is above the minimum clock frequency, then the performance monitor 620 decreases the frequency of the input clock signal CLK_IN. If the clock frequency of the input clock signal CLK_IN is already at the minimum clock frequency, then the performance monitor increases the supply voltage.

In another example, there may be a maximum clock frequency for the circuit 110. The maximum clock frequency may be the maximum clock frequency at which the clock source and/or performance monitor is configured to set for the input clock signal. In this example, when the droop threshold is decreased, the performance monitor 620 may either decrease the supply voltage $V_{DD}$ or increase the frequency of the input clock signal CLK_IN depending on whether the frequency of the input clock signal CLK_IN is at the maximum clock frequency. If the clock frequency of the input clock signal CLK_IN is below the maximum clock frequency, then the performance monitor 620 increases the frequency of the input clock signal CLK_IN. If the clock frequency of the input clock signal CLK_IN is already at the maximum clock frequency, then the performance monitor decreases the supply voltage.

Figure 10:
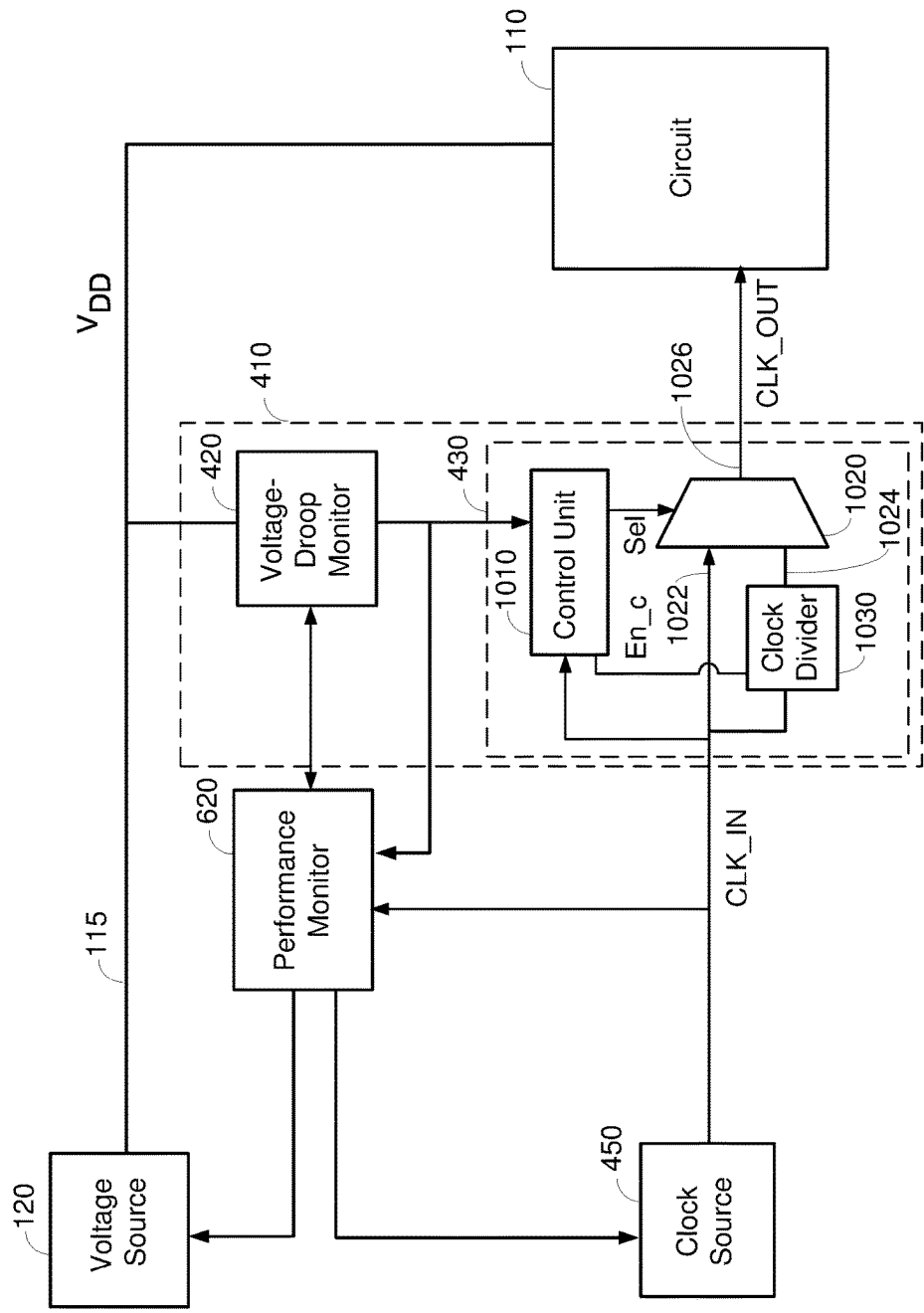
FIG. 10 shows an exemplary implementation of a clock reducer according to certain aspects of the present disclosure.

FIG. 10 shows an exemplary implementation of the clock reducer 430 according to certain aspects of the present disclosure. In this example, the clock reducer 430 includes a control unit 1010, a multiplexer 1020, and a clock divider 1030. The clock divider 1030 is configured to receive the input clock signal CLK_IN, and to reduce the frequency of the input clock signal CLK_IN to produce the reduced-frequency clock signal. The multiplexer 1020 has a first input 1022 configured to receive the input clock signal CLK_IN, a second input 1024 configured to receive the reduced-frequency clock signal from the clock divider 1030, and an output 1026 configured to output clock signal CLK_OUT to the circuit 110. The multiplexer 1020 is configured to select one of the input clock signal CLK_IN and the reduced-frequency clock signal, and to output the selected one of the input clock signal CLK_IN and the reduced-frequency clock signal to the circuit 110 under the control of the control unit 1010. The control unit 1010 is configured to receive a signal from the voltage droop monitor 420, and to control operations of the clock divider 1030 and the multiplexer 1020 based on the signal, as discussed further below.

In operation, the voltage droop monitor 420 may output the first logic value (e.g., zero) to the control unit 1010 to instruct the control unit 1010 to operate the clock reducer 430 in the first mode, and output the second logic value (e.g., one) to the control unit 1010 to instruct the control unit 1010 to operate the clock reducer 430 in the second mode.

When the control unit 1010 receives the first logic value, the control unit 1010 sends a select signal (denoted "Sel") to the multiplexer 1026 instructing the multiplexer 1020 to select the input clock signal CLK_IN. In this case, the multiplexer 1020 passes the input clock signal CLK_IN to the circuit 110. During this time, the clock divider 1030 may be disabled to conserve power.

When the signal from the voltage-droop monitor 420 changes from the first logic value to the second logic value to trigger droop mitigation, the control unit 1010 enables the clock divider 1030 and switches the multiplexer 1020 from the first input 1022 to the second input 1024. The control unit 1010 may time the switch from the input clock signal CLK_IN to the reduced-frequency clock signal such that the switch occurs when the input clock signal CLK_IN and reduced-frequency clock signal are logically low to prevent a glitch at the output of the multiplexer 1020.

When the signal from the voltage-droop monitor 420 changes from the second logic value back to the first logic value, the control unit switches back to the input clock signal CLK_IN. The control unit 1010 may time the switch from the reduced-frequency clock signal back to the input clock signal CLK such that the switch occurs when the reduced-frequency clock signal and the input clock signal CLK_IN are logically low to prevent a glitch at the output of the multiplexer 1020. After the switch, the control unit 1010 may disable the clock divider 1030.

Figure 11:
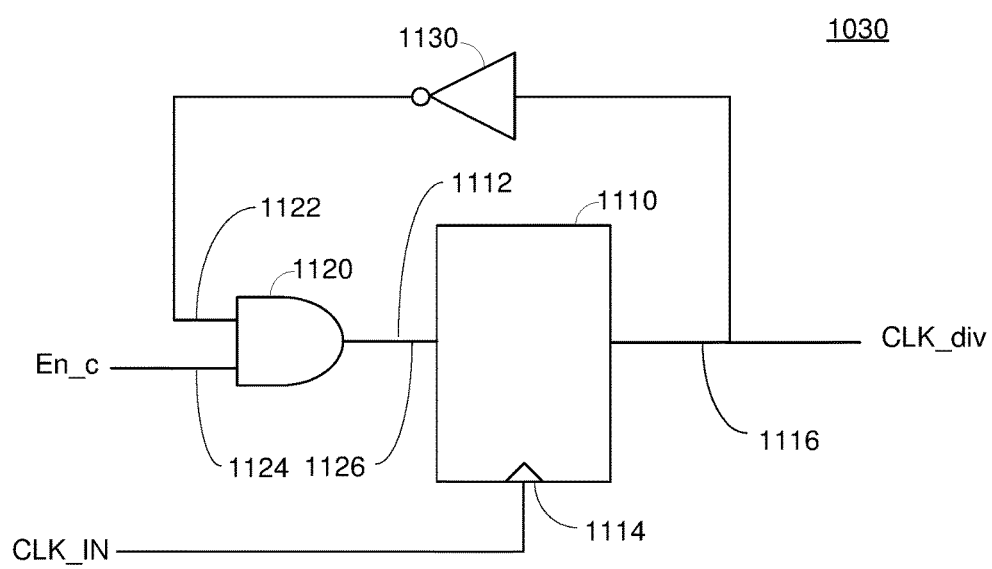
FIG. 11 shows an exemplary implementation of a clock divider according to certain aspects of the present disclosure.

FIG. 11 shows an exemplary implementation of the clock divider 1030 according to certain aspects of the present disclosure. In this example, the clock divider 1030 is configured to divide the frequency of the clock signal CLK_IN by two (i.e., reduce the frequency of the clock signal CLK_IN by 50%). The clock divider 1030 include a flip-flop 1110, an inverter 1130, and an AND gate 1120. The AND gate 1120 has a first input 1122, a second input 1124 that receives an enable signal (denoted "En_c") from the control unit 1010, and an output 1126. The flip-flop 1110 has a data input 1112 coupled to the output 1126 of the AND gate, a clock input 1114 that receives the input clock signal CLK_IN, and an output 1116 that outputs the reduced-frequency clock signal (denoted "CLK_div"). The flip-flop 1110 is configured to latch the logic value at the input 1112 on each rising edge of the input clock signal CLK_IN, and output the latched logic value for one period (cycle) of the input clock signal CLK_IN. The first input 1122 of the AND gate 1120 is coupled to the output 1116 of the flip-flop 1110 via the inverter 1130.

In operation, the control unit 1010 disables the clock divider 1030 by making the logic value of the enable signal En_c zero. This causes the AND gate 1120 to output a logic value of zero to the flip-flop 1110, and thus the flip-flop 1110 to output a logic value of zero. Therefore, when the control unit 1010 disables the clock divider 1030, the output of the clock divider 1030 remains logically low.

The control unit 1010 enables the clock divider 1030 by making the logic value of the enable signal EN_c one. This causes the output of the flip-flop 1110 to switch logic states on each rising edge of the input clock signal CLK_IN. As a result, the output of the flip-flop 1110 (which outputs the reduced-frequency clock signal CLK_div) switches logic states at half the frequency of the input clock signal CLK_IN. Thus, the reduced-frequency clock signal CLK_div has a clock frequency that is half the clock frequency of the input clock signal CLK_IN.

Figure 12:
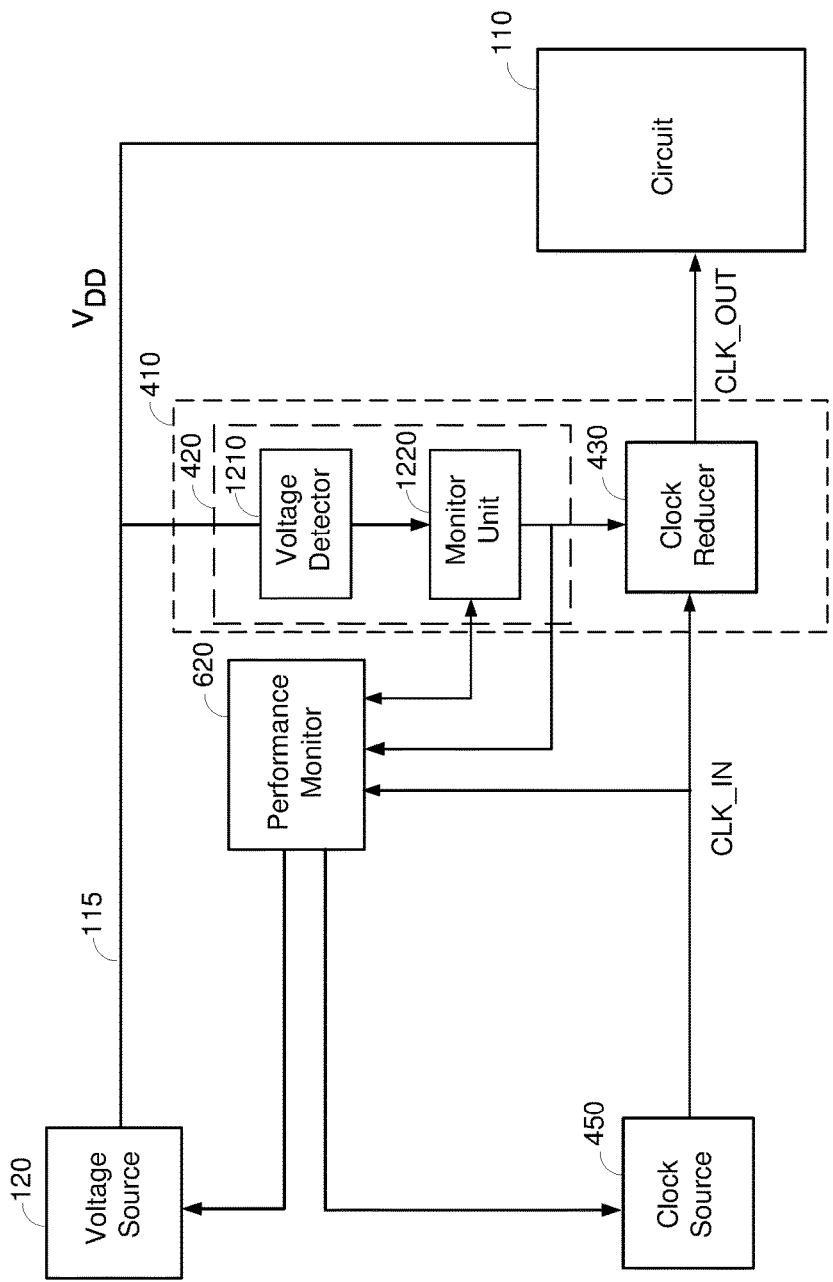
FIG. 12 shows an exemplary implementation of a voltage-based droop monitor according to certain aspects of the present disclosure.

FIG. 12 shows an example in which the voltage-droop monitor 420 uses voltage-based droop detection according to certain aspects of the present disclosure. In this example, the voltage-droop monitor 420 includes a voltage detector 1210 and a monitor unit 1220. The voltage detector 1210 is configured to measure the voltage level of the supply voltage $V_{DD}$, and output the measured voltage level to the monitor unit 1220.

The monitor unit 1220 compares the measured voltage level with a threshold voltage level, in which the droop threshold corresponds to the magnitude of the difference between the target voltage level of the supply voltage $V_{DD}$ (i.e., voltage level without droop) and the threshold voltage level. For example, if the target voltage level is 900 mV and the threshold voltage level is 850 mV, then the droop threshold is about 50 mV.

If the measured voltage level is above the threshold voltage level, then the monitor unit 1220 does not respond. This occurs when the magnitude of the voltage droop in the supply voltage is below the droop threshold. If the measured voltage level is equal to or below the threshold voltage level, then the monitor unit 1220 triggers droop mitigation (e.g., outputs the second logic value to the clock reducer 420 to operate the clock reducer 430 in the second mode). This occurs when the magnitude of the voltage droop is equal to or greater than the droop threshold.

In this example, the performance monitor 620 may decrease the droop threshold by increasing the threshold voltage level, decreasing the supply voltage $V_{DD}$, or both. The performance monitor 620 may decrease the supply voltage $V_{DD}$ by sending an instruction to the voltage source 120 to set the supply voltage level of the supply voltage $V_{DD}$ to a voltage level that is lower than the current voltage level. In this example, when the performance monitor 620 decreases the droop threshold, the performance monitor 620 may decrease the supply voltage by the same amount as the droop threshold or a different amount.

In this example, the performance monitor 620 may increase the droop threshold by decreasing the threshold voltage level, increasing the supply voltage $V_{DD}$, or both. The performance monitor 620 may increase the supply voltage $V_{DD}$ by sending an instruction to the voltage source 120 to set the supply voltage level of the supply voltage $V_{DD}$ to a voltage level that is higher than the current voltage level. In this example, when the performance monitor 620 increases the droop threshold, the performance monitor 620 may increase the supply voltage by the same amount as the droop threshold or a different amount.

Figure 13:
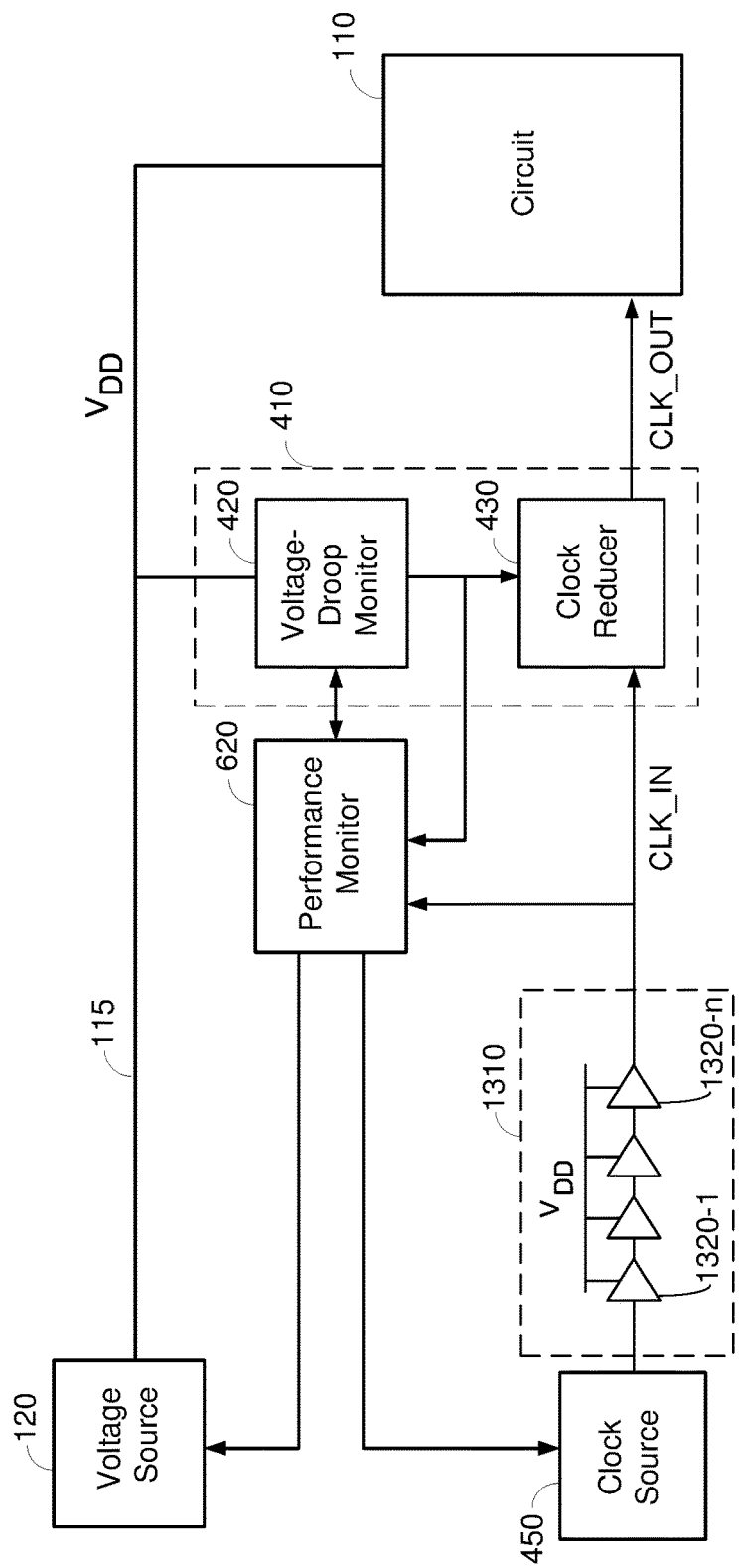
FIG. 13 shows an example of a delay device on a clock distribution path according to certain aspects of the present disclosure.

FIG. 13 shows an example in which the input clock signal CLK_IN is sent to the clock reducer 430 via clock delay device 1310. As discussed further below, the clock delay device 1310 exploits the clock-data compensation effect to provide the voltage-droop monitor 420 more time to respond to a voltage droop event. The clock delay device 1310 includes multiple buffers 1320-1 to 1320-n (i.e., inverters) along the clock path between the clock source 450 and the clock reducer 430. Each buffer adds a time delay to the input clock signal CLK_IN. Thus, the clock delay device 1310 delays the input clock signal CLK_IN by a delay approximately equal to the sum of the delays of the buffers 1320-1 to 1320-n. Each of the buffers 1320-1 to 1320-n is powered by the supply voltage $V_{DD}$. As a result, the delays of the buffers 1320-1 to 1320-n are affected by voltage droops in the supply voltage $V_{DD}$.

When a voltage droop occurs in the supply voltage $V_{DD}$, the delays of the buffers 1320-1 to 1320 in the clock delay device 1310 increase. This causes the clock period at the output of the clock delay device 1310 to stretch to compensate for increases in the delays of critical paths in the circuit 110 caused by the voltage droop. This phenomenon is known as the clock-data compensation effect. This effect is temporary (e.g., lasts for several clock cycles). While temporary, the clock-data compensation effect provides the voltage-droop monitor 420 with more time to respond to the voltage droop before the voltage droop causes timing errors in the circuit 110 by postponing critical path delay degradation of the circuit 110. In certain aspects, the clock delay device 1310 may be implemented with a delay device having a tunable delay in order to adjust the delay of the input clock signal CLK_IN.

Figure 14:
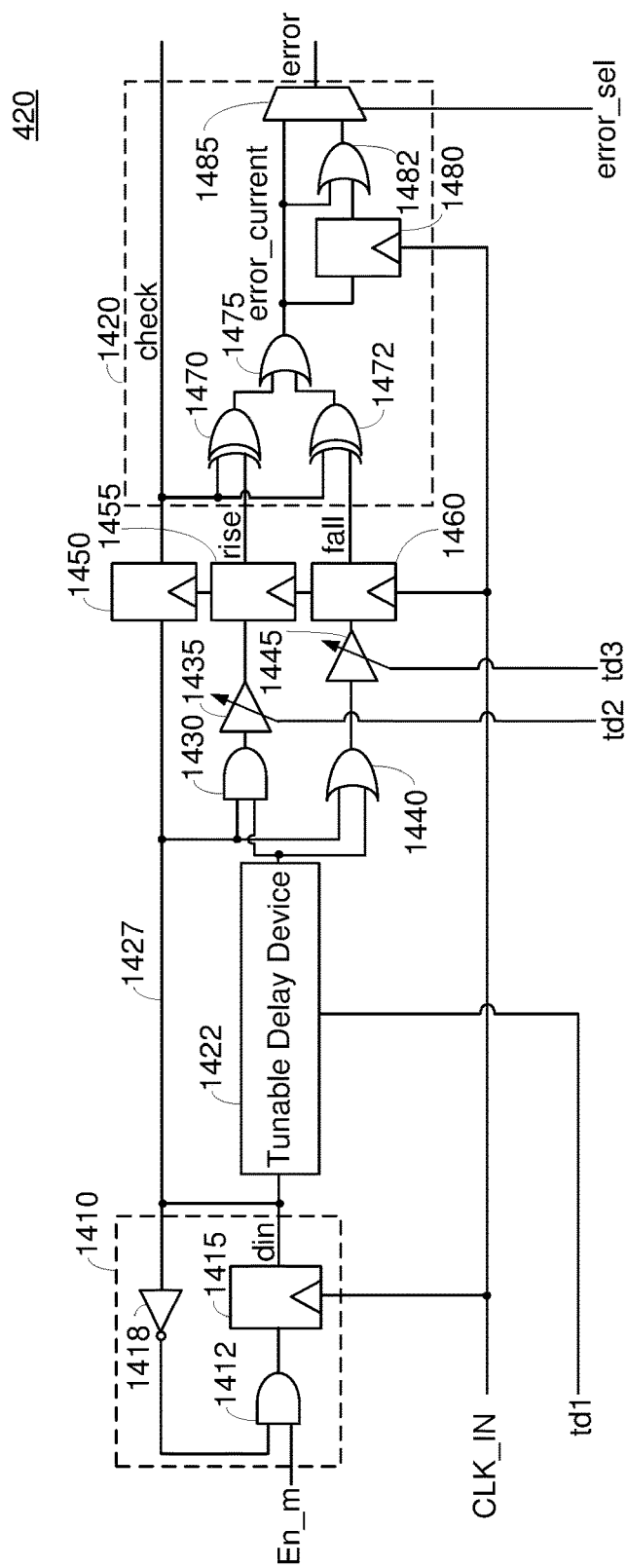
FIG. 14 shows an exemplary implementation of a timing-based droop monitor according to certain aspects of the present disclosure.

FIG. 14 shows an example in which the voltage-droop monitor 420 uses timing-based droop detection according to certain aspects of the present disclosure. In this example, the voltage-droop monitor 420 includes a driving circuit 1410, a tunable delay device 1422, receiving flip-flops 1450, 1455 and 1460, and an error detection circuit 1420. The voltage-droop monitor 420 also includes an AND gate 1430, a first fine tunable delay device 1435, an OR gate 1440, and a second fine tunable delay device 1445, as discussed further below.

The driving circuit 1410 receives an enable signal (denoted "En_m") and the input clock signal CLK_IN. For the example in which the delay device 1310 delays the input clock signal CLK_IN to the clock reducer 430, the input clock signal CLK_IN shown in FIG. 14 may bypass the delay device 1310. The driving circuit 1410 is configured to output a data signal (denoted "din") that switches logic states (toggles) on each rising edge of the clock signal CLK_IN.

In the example in FIG. 14, the driving circuit 1410 includes a driving flip-flop 1415, an inverter 1418, and an AND gate 1412. The AND gate 1412 has one input coupled to the output of the driving flip-flop 1415 via the inverter 1418, another input coupled to the enable signal En_m, and an output coupled to the data input of the driving flip-flop 1415. The clock input of the driving flip-flop 1415 is driven by the input clock signal CLK_IN.

In operation, the driving circuit 1410 is enabled when the enable signal En_m is one. In this case, the driving circuit 1410 outputs a data signal din that switches logic states (toggels) on each rising edge of the input clock signal CLK_IN. The driving circuit 1410 is disabled when the enable signal En_m is zero. In this case, the output of the driving circuit 1410 stays logically low.

The output of the driving circuit 1410 is coupled to the data input of receiving flip-flop 1450 (also referred to as a check flip-flop) via a fast path 1427, which has a much shorter delay than the tunable delay device 1422. The short delay of the fast path 1427 ensures that the data signal din arrives at the check flip-flop 1450 fast enough to meet setup time at the check flip-flop 1450 even in the presence of a large voltage droop. As discussed further below, the output of the check flip-flop 1450 is used by the error detection circuit 1420 to detect a timing error due to voltage droop.

The output of the driving circuit 1410 is also coupled to the data input of receiving flip-flop 1455 (also referred to as a rise flip-flop) via a first delay path that includes the tunable delay device 1422, the AND gate 1430 and the first tunable delay device 1435. The AND gate 1430 has a first input coupled to the fast path 1427, and a second input coupled to the output of the tunable delay device 1422, as shown in FIG. 14. The first tunable delay device 1435 is coupled between the output of the AND gate 1430 and the data input of the rise flip-flop 1455.

The output of the driving circuit 1410 is also coupled to the data input of receiving flip-flop 1460 (also referred to as a fall flip-flop) via a second delay path that includes the tunable delay device 1422, the OR gate 1440 and the second tunable delay device 1445. The OR gate 1440 has a first input coupled to the fast path 1427, and a second input coupled to the output of the tunable delay device 1422, as shown in FIG. 14. The second fine tunable delay device 1445 is coupled between the output of the OR gate 1440 and the data input of the fall flip-flop 1460.

The clock input of each of the receiving flip-flops 1450, 1455 and 1460 is driven by the clock signal CLK_IN. In one example, each of the receiving flip-flops is configured to latch (capture) the logic value at the respective data input on each active edge of the clock signal CLK_IN. Each active edge may be a rising edge of the clock signal CLK_IN if the receiving flip-flops are positive-edge triggered. In another example, each active edge may be a falling edge of the clock signal CLK_IN if the receiving flip-flops are negative-edge triggered. In this example, the driving circuit 1410 may be configured to switch (toggle) the data signal on falling edges of the clock signal CLK_IN instead of rising edges of the clock signal CLK_IN.

The error detection circuit 1420 is coupled to the outputs of the receiving flip-flops 1450, 1455 and 1460. As discussed further below, the error detection circuit 1420 examines the logic values at the outputs of the receiving flip-flops 1450, 1455 and 1460 to detect a timing error in the first delay path and/or a timing error in the second delay path due to a voltage droop.

As discussed further below, the time delay of the tunable delay device 1422 determines a timing margin for the first and second delay paths. The timing margin may correspond to an amount of time by which the data signal din meets timing requirements (e.g., setup times) at the rise flip-flip 1455 and fall flip-flop 460. The shorter the time delay of the tunable device 1422, the larger the timing margin, and, the longer the time delay of the tunable device 1422, the smaller the timing margin. Thus, the timing margin may be adjusted by adjusting (tuning) the time delay of the tunable delay device 1422, as discussed further below.

Operation of the timing-based droop monitor will now be described according to certain aspects of the present disclosure.

For a rising edge of the data signal din, the data signal din propagates quickly from the driving circuit 1410 to the data input of the check flip-flop 1450 via the fast path 1427. The data signal din also propagates quickly to the data input of the fall flip-flop 1460 via the fast path 1427, the OR gate 1440 and the second fine tunable delay device 1445. This is because the OR gate 1440 passes the rising edge of the data signal din on the fast path 1427 to the data input of the fall flip-flop 1460 via the second fine tunable delay device 1445. Thus, the rising edge of the data signal din bypasses the tunable delay device 1422 for the fall flip-flop 1460. As a result, both the check flip-flop 1450 and the fall flip-flop correctly latch a logic value of one on the next rising edge of the clock signal CLK_IN. The logic value of one latched by the fall flip-flop 1460 sets up the fall flip-flop 1460 for the following clock cycle, as discussed further below.

For the rising edge of the data signal din, the data signal din propagates to the data input of the rise flip-flop 1455 through the first delay path which includes the tunable delay device 1422, the AND gate 1430 and the second tunable delay device 1435. This is because the AND gate 1430 blocks the rising edge on the fast path 1427 from the rise flip-flop 1455. The rise flip-flop 1455 correctly latches a logic value of one on the next rising edge of the clock signal CLK_IN if the rising edge of the data signal din arrives at the data input of the rise flip-flop 1455 in time to meet the setup time at the rise flip-flop 1455.

The error detection circuit 1420 then compares the output the check flip-flop 1450 with output of the rise flip-flop 1455 to determine whether timing is being met for the rising edge of the data signal din. If both outputs are the same (logic one), then the error detection circuit 1420 determines that timing is being met. If the outputs are different, then the error detection circuit 1420 determines that timing is not being met (e.g., due to a voltage droop), as discussed further below.

For a falling edge of the data signal din, the data signal din propagates quickly from the driving circuit 1410 to the data input of the check flip-flop 1450 via the fast path 1427. The data signal din also propagates quickly to the data input of the rise flip-flop 1455 via the fast path 1427, the AND gate 1430 and the first fine tunable delay device 1435. This is because the output of the AND gate 1430 falls on the falling edge of the data signal din on the fast path 1427. Thus, the falling edge of the data signal din bypasses the tunable delay device 1422 for the rise flip-flop 1455. As a result, both the check flip-flop 1450 and the rise flip-flop 1455 correctly latch a logic value of zero on the next rising edge of the clock signal CLK_IN. The logic value of zero latched by the rise flip-flop 1455 sets up the rise flip-flop for the following clock cycle.

For the falling edge of the data signal din, the data signal din propagates to the data input of the fall flip-flop 1460 through second delay path which includes the tunable delay device 1422, the OR gate 1440 and the second tunable delay device 1445. This is because the output of the OR gate 1440 does not fall until the OR gate 1440 receives the falling edge of the data signal din from the output of the tunable delay device 1422. The fall flip-flop 1460 correctly latches a logic value of zero on the next rising edge of the clock signal CLK_IN if the falling edge of the data signal din arrives at the data input of the fall flip-flop 1460 in time to meet the setup time at the fall flip-flop 1460.

The error detection circuit 1420 then compares the output the check flip-flop 1450 with output of the fall flip-flop 1460 to determine whether timing is being met for the falling edge of the data signal din. If both outputs are the same (logic zero), then the error detection circuit 1420 determines that timing is being met. If the outputs are different, then the error detection circuit 1420 determines that timing is not being met (e.g., due to a voltage droop).

In certain aspects, the delay time of the tunable delay device 1422 may be set to provide a certain timing margin for the first and second delay paths at the target supply voltage level. The timing margin is common to both delay paths since the tunable delay device 1422 is common to both delay paths. The tunable delay device 1422 includes multiple buffers that are powered by the supply voltage $V_{DD}$ such that delays of the buffers increase as the supply voltage level decreases due to voltage droop. As a result, the delay of the tunable delay device 1422 is affected by voltage droops in the supply voltage (similar to delay paths in the circuit 110). Generally, the delay of the tunable delay device 1422 increases as the supply voltage level decreases due to voltage droop. If the magnitude of the voltage droop is large enough, then a point is reached at which the first delay path and/or second delay path no longer meet timing. The error detection circuit 1420 detects this by detecting a difference between the outputs of the check flip-flop 1450 and the rise flip-flop 1455 and/or a difference between the outputs of the check flip-flop 1450 and the fall flip-flop 1460. When this occurs, the error detection circuit 1420 outputs an error signal to trigger droop mitigation, as discussed further below.

The timing margin determines the magnitude of voltage droop needed to cause a timing error. The larger the timing margin, the larger the magnitude of voltage droop needed to cause a timing error, and, the smaller the timing margin, the smaller the magnitude of voltage droop needed to cause a timing error. As discussed above, the timing margin is adjusted by adjusting (tuning) the delay of the tunable delay device 1422, in which increasing the delay decreases the timing margin and decreasing the delay increases the timing margin. Thus, the magnitude of voltage droop needed to cause a timing error may be adjusted by adjusting the delay of the tunable delay device 1422. The shorter the delay, the larger the magnitude of voltage droop needed to cause a timing error, and, the longer the delay, the smaller the magnitude of voltage droop needed to cause a timing error.

In this example, the droop threshold of the voltage-droop monitor may be defined as the magnitude of voltage droop needed to cause a timing error. Thus, the error detection circuit 1420 outputs the error signal when the voltage droop in the supply voltage is equal to or greater than the droop threshold.

In this example, the droop threshold may be adjusted by adjusting (tuning) the delay of the tunable delay device 1422. The shorter the delay, the larger the magnitude of voltage droop needed to cause a timing error (and hence the larger the droop threshold), and, the longer the delay, the smaller the magnitude of voltage droop needed to cause a timing error (and hence the smaller the droop threshold). Thus, in this example, the performance monitor 620 may increase the droop threshold by decreasing the delay setting of the tunable delay device 1422, and decrease the droop threshold by increasing the delay setting of the tunable delay device 1422.

As discussed above, the error detection circuit 1420 outputs the error signal to trigger droop mitigation. In this regard, the clock reducer 430 may be coupled to the output of the error detection circuit 1420 to receive the error signal. The clock reducer 430 may be configured to operate in the second mode (i.e., reduce the clock frequency at the circuit 110) when the clock reducer 430 receives the error signal from the error detection circuit 1420. The clock reducer 430 may be configured to operate in the first mode (i.e., pass the input clock signal CLK_IN circuit 110) when the error signal is not received. For example, the error signal may have a logic value of one. In this example, the clock reducer 430 may switch from the first mode to the second mode when the output of the error detection circuit 1420 switches from zero to one indicating a timing error. As discussed above, the clock signal CLK_IN to the clock reducer 430 may be delayed by delay device 1310 to give the voltage-droop monitor 420 more time to respond to droop by exploiting the clock-data compensation effect.

In the example in FIG. 14, the error detection circuit 1420 includes a first XOR gate 1470, a second XOR gate 1472, and an OR gate 1475. The first XOR gate 1470 has a first input coupled to the output of the check flip-flop 1450 and second input coupled to the output of the rise flip-flop 1455. The second XOR gate 1472 has a first input coupled to the output of the check flip-flop 1450 and a second input coupled to the output of the fall flip-flop 1460. The OR gate 1475 has a first input coupled to the output of the first XOR gate 1470 and a second input coupled to the output of the second XOR gate 1472. The OR gate 1475 outputs a logic one when the outputs of the check flip-flop 1450 and the rise flip-flop 1455 are different, the outputs of the check flip-flop 1450 and the fall flip-flop 1460 are different, or both. As a result, the OR gate 1475 outputs a logic one when there is a timing error. Thus, in this example, the error signal has a logic value of one.

The error detection circuit 1420 also includes an error flip-flop 1480, an OR gate 1482, and a multiplexer 1485. The multiplexer 1485 has a first input coupled to the output of OR gate 1475 and a second input coupled to OR gate 1482. The output of the multiplexer 1485 outputs the error signal discussed above.

The error flip-flop 1480 has a data input coupled to the output of the OR gate 1475, and a clock input that is driven by the clock signal CLK_IN. The OR gate 1482 has a first input coupled to the output of the OR gate 1475 and a second input coupled to the output of the error flip-flop 1480. Thus, the OR gate 1482 outputs a logic one indicating an error if the current output value of OR gate 1475 is one, the output value of OR gate 1475 in the previous clock cycle (which is latched by the error flip-flop 1480) is one, or both.

The multiplexer 1485 is configured to select the output of OR gate 1475 or the output of OR gate 1482 according to an error mode select signal (denoted "error_sel"). Thus, the error detection circuit 1420 can operate in one of two modes based on the output selected by the multiplexer 1485. In the first mode, the multiplexer 1485 selects the output of OR gate 1475. In this mode, the error detection circuit 1420 outputs the current error signal output by OR gate 1475. In the second mode, the multiplexer 1485 selects the output of OR gate 1482. In this mode, the error detection circuit 1420 outputs the OR of the current logic value of the error signal and the previous logic value of the error signal latched by the error flip-flop 1480.

Figure 15:
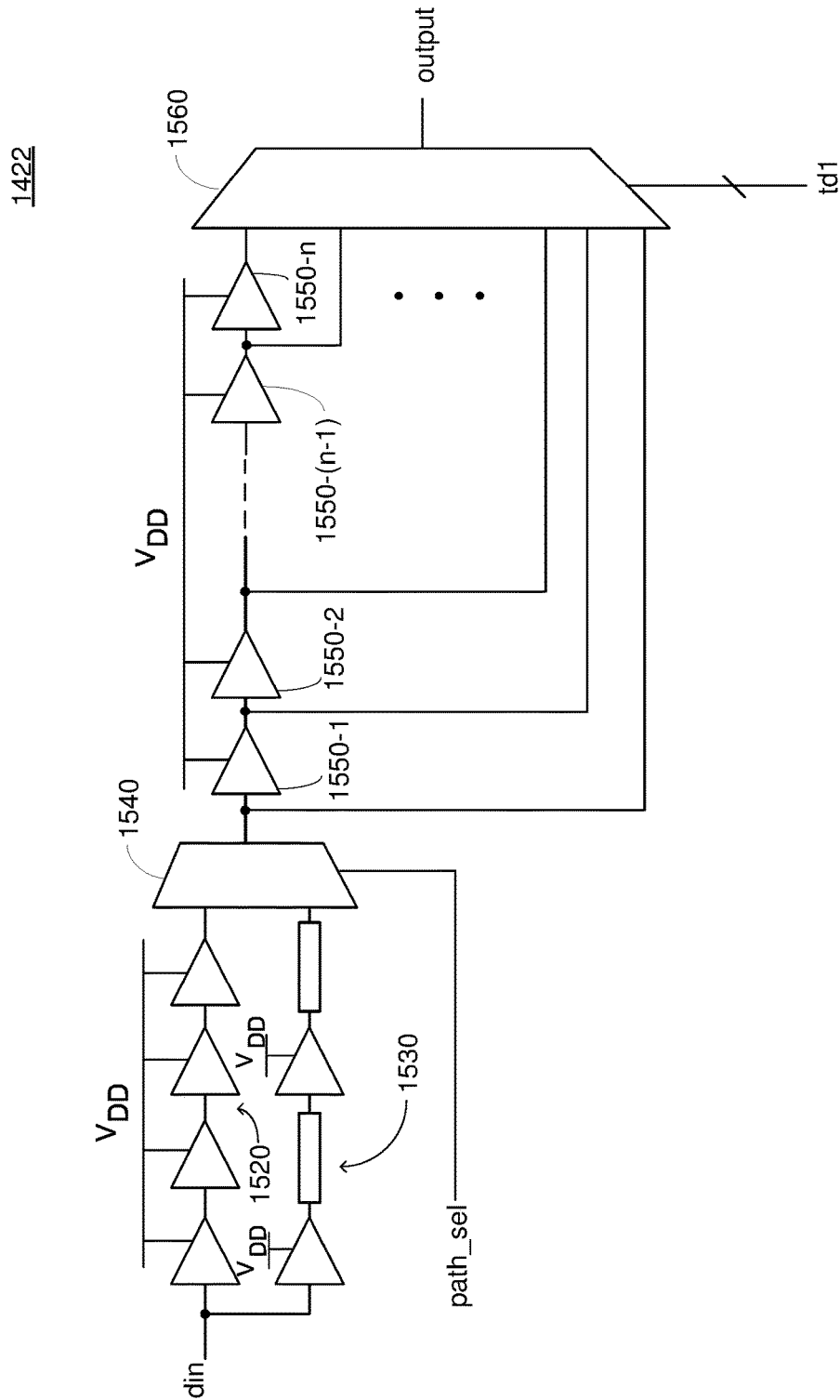
FIG. 15 shows an example of a tunable delay device according to certain aspects of the present disclosure.

FIG. 15 shows an exemplary implementation of the tunable delay circuit 1422 according to certain aspect of the present disclosure. In this example, the tunable delay circuit 1422 includes two delay paths 1520 and 1530 and a first multiplexer 1540 configured to select one of the delay paths according to a path select signal (denoted "path_sel"). Path 1520 includes multiple buffers, and path 1530 includes a combination of buffers and interconnect delay components. The buffers are powered by the supply voltage $V_{DD}$, as shown in FIG. 15.

The tunable delay circuit 1422 also includes a delay chain made up of multiple buffers 1550-1 to 1550-n coupled in series, and a second multiplexer 1560. Each buffer may be implemented by a pair of inverters. The second multiplexer 1560 has multiple inputs, in which each input is coupled to a different point (tap) on the delay chain, as shown in FIG. 15. As a result, each of the inputs of the second multiplexer 1560 is coupled to a different number of the buffers 1550-1 to 1550-n in the delay chain, and hence a different delay path. In this example, the multiplexer 1560 selects one of the delay paths (and hence the corresponding time delay) according to a time delay select signal (denoted "td1"), and outputs the signal in the selected delay path as the output of the tunable delay device 1422. Thus, the delay of the tunable delay device 1422 is adjusted by controlling the delay path selected by the second multiplexer 1560 using the time delay select signal td1. In this regard, the time delay select signal td1 may be a multi bit delay setting, in which the values of the bits specify the delay path selected by the second multiplexer 1560, and hence the delay of the tunable delay device 1422.

As shown in FIG. 15, the multiple buffers 1550-1 to 1550-*n* in the delay chain are powered by the supply voltage $V_{DD}$. Thus, the delays of the buffers 1550-1 to 1550-*n* are affected by droops in the supply voltage. Generally, the delays of the buffers increase as the magnitude of a voltage droop increases.

Returning to FIG. 14, the delay setting of the tunable delay device 1422 is adjusted using the time delay select signal td1 discussed above. Thus, in this example, the performance monitor 620 may adjust the droop threshold by adjusting the delay setting of the tunable delay device 1422 using time delay select signal td1. For example, the performance monitor 620 may decrease the droop threshold by increasing the delay setting of the tunable delay device 1422, which reduces the timing margin of the first and second delay paths. In this example, the performance monitor 620 may increase the delay setting by adjusting the time delay select signal (e.g., changing one or more bits of the select signal) to cause the second multiplexer 1560 to select a delay path with a larger number of buffers. In another example, the performance monitor 620 may increase the droop threshold by decreasing the delay setting of the tunable delay device 1422, which increases the timing margin of the first and second delay paths. In this example, the performance monitor 620 may decrease the delay setting by adjusting the time delay select signal (e.g., changing one or more bits of the select signal) to cause second multiplexer 1560 to select a delay path with fewer buffers.

The first fine tunable delay device 1435 is configured to fine tune the delay of the first delay path according to time delay select signal td2. In this regard, the first fine tunable delay device 1435 allows fine tuning of the delay of the first delay path in smaller delay increments and over a smaller range than the tunable delay device 1422. For example, the entire tunable range of the first fine tunable delay device 1435 may approximately span the delay of one of the buffers in the tunable delay device 1422.

The second fine tunable delay device 1445 is configured to fine tune the delay of the second delay path according to time delay select signal td3. In this regard, the second fine tunable delay device 1445 allows fine tuning of the delay of the second delay path in smaller delay increments and over a smaller range than the tunable delay device 1422. The first and second fine tunable delay devices allow the delays of the first delay path and the second delay paths to be independently tuned over a small range to account for small differences in rise and fall setup times.

In certain aspects, an auto-calibration procedure may be performed on the voltage-droop monitor 420 to set the initial timing margin (and hence droop threshold) for the voltage-droop monitor 420 at an initial supply voltage and/or initial frequency of the input clock signal CLK_IN. The auto-calibration procedure may include operating the circuit 110 in a safe mode (e.g., operating the circuit 110 at the reduced clock frequency) during calibration since the voltage-droop mitigation circuit 410 may not be able to perform droop mitigation during calibration. The auto-calibration procedure may also include finding delay settings of the delay devices 1422, 1435 and 1445 that result in a timing margin of approximately zero. This may be accomplished by adjusting (tuning) the delay settings of the delay devices 1422, 1435 and 1445 while observing the output of the error detection circuit 1420 to find the highest delay settings that result in no error signal at the output of the error detection circuit 1420. After the delay settings corresponding to the timing margin of zero are determined, a desired initial timing margin is added to the voltage-droop monitor by decreasing the delay setting of the tunable delay device 1422 by a time delay corresponding to the desired initial timing margin. After the initial timing margin (and hence initial droop threshold) is set, the performance monitor 620 may make adjustments to the timing margin (and hence droop threshold) during operation, as discussed above. Further details on the auto-calibration procedure may be found in U.S. Pat. No. 9,413,344, titled "Automatic Calibration Circuits for Operational Calibration of Critical-Path Time Delays in Adaptive Clock Distribution Systems, and Related Methods and Systems," issued on Aug. 9, 2016, the entire specification of which is incorporated herein by reference.

Figure 16:
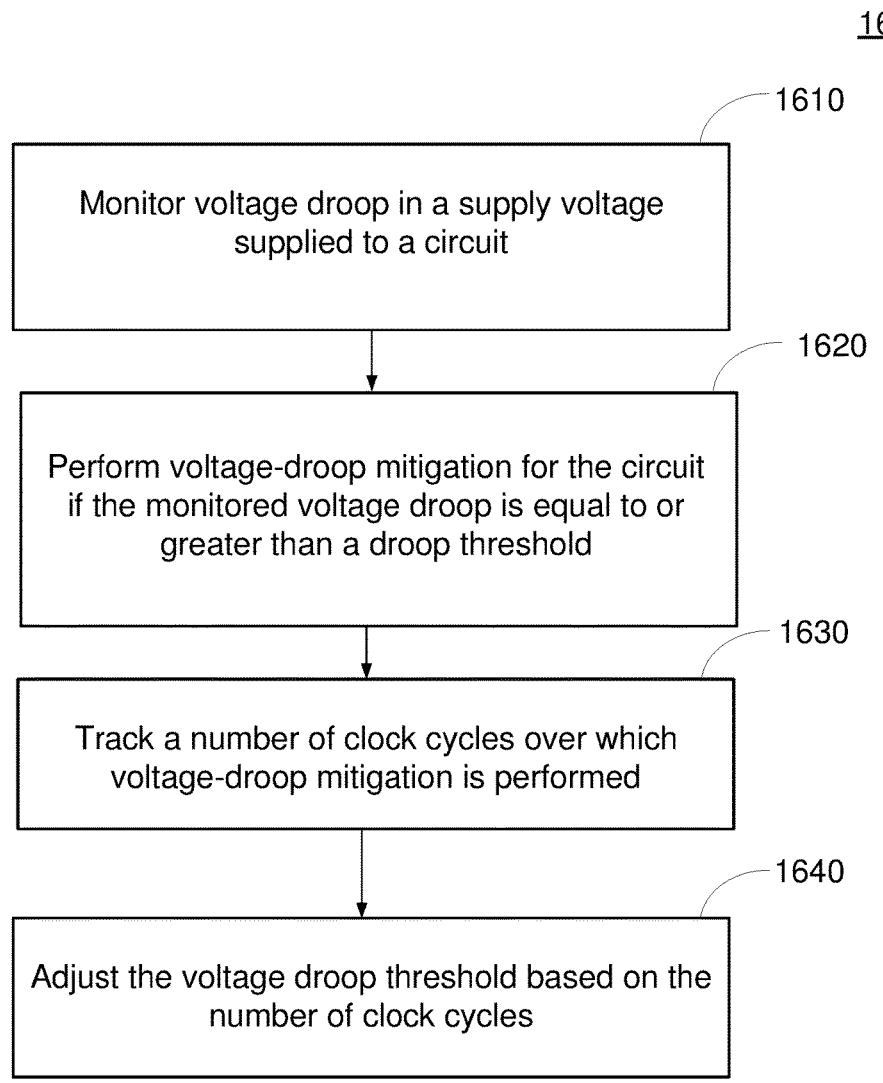
FIG. 16 is a flowchart showing an exemplary method for adjusting a droop threshold according to aspects of the present disclosure.

FIG. 16 is a flowchart illustrating a method 1600 for adjusting a droop threshold according to certain aspects. The method 1600 may be performed by the voltage-droop mitigation circuit 410 and the performance monitor 620.

At step 1610, voltage droop in a supply voltage supplied to a circuit is monitored. The voltage droop may be monitored using voltage-based droop monitoring or timing-based droop monitoring.

At step 1620, voltage-droop mitigation is performed for the circuit if the monitored voltage droop is equal to or greater than the droop threshold. The voltage-droop mitigation may include reducing the clock frequency of the circuit. The droop threshold may be set by setting a voltage threshold level for voltage-based droop monitoring or setting a delay of a tunable delay device in a delay path for timing-based droop monitoring.

At step 1630, a number of clock cycles over which the voltage-droop mitigation is performed within a time duration is tracked. The number of clock cycles may be tracked, for example, by incrementing the count value of a counter for each clock cycle during which droop mitigation is performed.

At step 1640, the droop threshold is adjusted based on the number of clock cycles. For example, the droop threshold may be decreased if the number of clock cycles is below a first threshold and increased if the number of clock cycles is above a second threshold.

Figure 17:
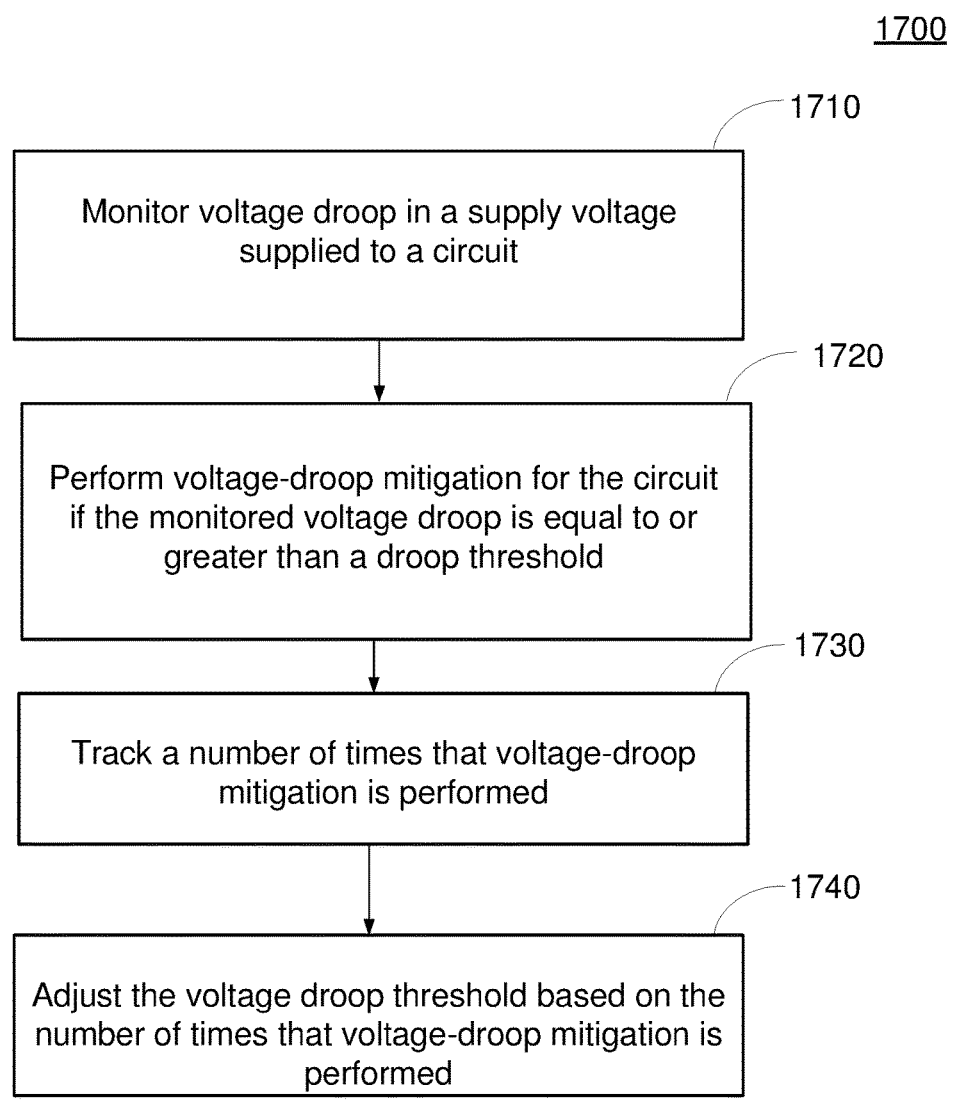
FIG. 17 is a flowchart showing another exemplary method for adjusting a droop threshold according to aspects of the present disclosure.

FIG. 17 is a flowchart illustrating a method 1700 for adjusting a droop threshold according to certain aspects. The method 1700 may be performed by the voltage-droop mitigation circuit 410 and the performance monitor 620.

At step 1710, voltage droop in a supply voltage supplied to a circuit is monitored. The voltage droop may be monitored using voltage-based droop monitoring or timing-based droop monitoring.

At step 1720, voltage-droop mitigation is performed for the circuit if the monitored voltage droop is equal to or greater than the droop threshold. The voltage-droop mitigation may include reducing the clock frequency of the circuit. The droop threshold may be set by setting a voltage threshold level for voltage-based droop monitoring or setting a delay of a tunable delay device in a delay path for timing-based droop monitoring.

At step 1730, a number of times that the voltage-droop mitigation is performed within a time duration is tracked. The number of times that the voltage-droop is performed may be tracked, for example, by incrementing the count value of a counter each time voltage-droop mitigation is triggered.

At step 1740, the droop threshold is adjusted based on the number of times that voltage-droop mitigation is performed within the time duration. For example, the droop threshold may be decreased if the number of times that voltage-droop mitigation is performed within the time duration is below a first threshold and increased if the number of times that voltage-droop mitigation is performed within the time duration is above a second threshold.

The performance monitor 620 and voltage-droop monitor 420 discussed above may be implemented with a general-purpose processor, a digital signal processor (DSP), an application specific integrated circuit (ASIC), a field programmable gate array (FPGA) or other programmable logic device, discrete hardware components (e.g., logic gates), or any combination thereof designed to perform the functions described herein. A processor may perform the functions described herein by executing software comprising code for performing the functions. The software may be stored on a computer-readable storage medium, such as a RAM, a ROM, an EEPROM, an optical disk, and/or a magnetic disk.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A system, comprising:
    a voltage-droop mitigation circuit configured to monitor voltage droop in a supply voltage supplied to a circuit, and to perform voltage-droop mitigation for the circuit if the monitored voltage droop is equal to or greater than a droop threshold; and
    a performance monitor configured to track a number of clock cycles over which the voltage-droop mitigation circuit performs the voltage-droop mitigation within a time duration, to compare the number of clock cycles with a first threshold number, and to decrease both the droop threshold and the supply voltage if the number of clock cycles is below the first threshold number.

2. The system of claim 1, wherein the voltage-droop mitigation circuit is configured to:
    perform voltage-droop mitigation by reducing a frequency of an input clock signal to produce a reduced-frequency clock signal, and outputting the reduced-frequency clock signal to the circuit; and
    pass the input clock signal to the circuit when the voltage-droop mitigation is not being performed.

3. The system of claim 2, wherein the number of clock cycles is a number of clock cycles of the input clock signal or a number of cycles of the reduced-frequency clock signal.

4. The system of claim 1, wherein the voltage-droop mitigation circuit is configured to:
    perform voltage-droop mitigation by reducing a frequency of an input clock signal to produce a reduced-frequency clock signal, and outputting the reduced-frequency clock signal to the circuit;
    pass the input clock signal to the circuit when the voltage-droop mitigation is not being performed; and
    increase a frequency of the input clock signal if the droop threshold is decreased.

5. The system of claim 1, wherein the performance monitor is configured to compare the number of clock cycles with a second threshold number, and to increase the droop threshold if the number of clock cycles is above the second threshold number.

6. The system of claim 1, wherein the voltage-droop mitigation circuit comprises:
    a driving circuit configured to output a data signal;
    a receiving flip-flop;
    a delay path between the driving circuit and the receiving flip-flop, wherein the delay path includes a tunable delay device, the data signal propagates from the driving circuit to the receiving flip-flop via the delay path, and the receiving flip-flop is configured to latch logic values of the data signal on active edges of an input clock signal; and
    an error detection circuit configured to detect a timing error at the receiving flip-flop based on the latched logic values, and to trigger voltage-droop mitigation if the timing error is detected;
    wherein the performance monitor is configured to decrease the droop threshold by adjusting a delay setting of the tunable delay device.

7. The system of claim 6, wherein the tunable delay device comprises:
    a plurality of delay paths, each of the plurality of delay paths including a different number of buffers powered by the supply voltage; and
    a multiplexer configured to select one of the plurality of delay paths according to a delay select signal, wherein the performance monitor is configured to adjust the delay setting of the tunable delay device by adjusting the delay select signal.

8. A method for adjusting a droop threshold, comprising:
    monitoring voltage droop in a supply voltage supplied to a circuit;
    performing voltage-droop mitigation for the circuit if the monitored voltage droop is equal to or greater than the droop threshold;
    tracking a number of clock cycles over which the voltage-droop mitigation is performed within a time duration;
    comparing the number of clock cycles with a first threshold number; and
    decreasing both the droop threshold and the supply voltage if the number of clock cycles is below the first threshold number.

9. The method of claim 8, wherein performing voltage-droop mitigation comprises reducing a frequency of an input clock signal to produce a reduced-frequency clock signal, and outputting the reduced-frequency clock signal to the circuit, and wherein the method further comprises passing the input clock signal to the circuit when the voltage-droop mitigation is not being performed.

10. The method of claim 9, wherein the number of clock cycles is a number of clock cycles of the input clock signal or a number of cycles of the reduced-frequency clock signal.

11. The method of claim 8, wherein performing voltage-droop mitigation comprises reducing a frequency of an input clock signal to produce a reduced-frequency clock signal, and outputting the reduced-frequency clock signal to the circuit, and wherein the method further comprises passing the input clock signal to the circuit when the voltage-droop mitigation is not being performed, and increasing a frequency of the input clock signal if the droop threshold is decreased.

12. The method of claim 8, further comprising comparing the number of clock cycles with a second threshold number, and increasing the droop threshold if the number of clock cycles is above the second threshold number.

13. The method of claim 8, wherein monitoring voltage droop comprises detecting a timing error in a delay path caused by the voltage droop, the delay path including a tunable delay device, and wherein performing voltage-droop mitigation for the circuit if the monitored voltage droop is equal to or greater than the droop threshold comprises performing voltage-droop mitigation for the circuit if the timing error is detected, and decreasing the droop threshold comprises adjusting a delay setting of the tunable delay device.

14. A system, comprising:
   a voltage-droop mitigation circuit configured to monitor voltage droop in a supply voltage supplied to a circuit, and to perform voltage-droop mitigation for the circuit if the monitored voltage droop is equal to or greater than a droop threshold; and
   a performance monitor configured to track a number of times that the voltage-droop mitigation circuit performs the voltage-droop mitigation within a time duration, to compare the number of times that the voltage-droop mitigation circuit performs the voltage-droop mitigation within the time duration with a first threshold number, and to decrease both the droop threshold and the supply voltage if the number of times that the voltage-droop mitigation circuit performs the voltage-droop mitigation within the time duration is below the first threshold number.

15. The system of claim 14, wherein the voltage-droop mitigation circuit is configured to:
   perform voltage-droop mitigation by reducing a frequency of an input clock signal to produce a reduced-frequency clock signal, and outputting the reduced-frequency clock signal to the circuit;
   pass the input clock signal to the circuit when the voltage-droop mitigation is not being performed; and
   increase a frequency of the input clock signal if the droop threshold is decreased.

16. The system of claim 14, wherein the performance monitor is configured to compare the number of times that the voltage-droop mitigation circuit performs the voltage-droop mitigation within the time duration with a second threshold number, and to increase the droop threshold if the number of times that the voltage-droop mitigation circuit performs the voltage-droop mitigation within the time duration is above the second threshold number.

17. The system of claim 14, wherein the voltage-droop mitigation circuit comprises:
   a driving circuit configured to output a data signal;
   a receiving flip-flop;
   a delay path between the driving circuit and the receiving flip-flop, wherein the delay path includes a tunable delay device, the data signal propagates from the driving circuit to the receiving flip-flop via the delay path, and the receiving flip-flop is configured to latch logic values of the data signal on active edges of an input clock signal; and
   an error detection circuit configured to detect a timing error at the receiving flip-flop based on the latched logic values, and to trigger voltage-droop mitigation if the timing error is detected;
   wherein the performance monitor is configured to decrease the droop threshold by adjusting a delay setting of the tunable delay device.

18. The system of claim 17, wherein the tunable delay device comprises:
   a plurality of delay paths, each of the plurality of delay paths including a different number of buffers powered by the supply voltage; and
   a multiplexer configured to select one of the plurality of delay paths according to a delay select signal, wherein the performance monitor is configured to adjust the delay setting of the tunable delay device by adjusting the delay select signal.

19. A method for adjusting a droop threshold, comprising:
   monitoring voltage droop in a supply voltage supplied to a circuit;
   performing voltage-droop mitigation for the circuit if the monitored voltage droop is equal to or greater than the droop threshold;
   tracking a number of times that the voltage-droop mitigation is performed within a time duration;
   comparing the number of times that the voltage-droop mitigation is performed within the time duration with a first threshold number; and
   decreasing both the droop threshold and the supply voltage if the number of times that the voltage-droop mitigation is performed within the time duration is below the first threshold number.

20. The method of claim 19, wherein performing voltage-droop mitigation comprises reducing a frequency of an input clock signal to produce a reduced-frequency clock signal, and outputting the reduced-frequency clock signal to the circuit, and wherein the method further comprises passing the input clock signal to the circuit when the voltage-droop mitigation is not being performed, and increasing a frequency of the input clock signal if the droop threshold is decreased.

21. The method of claim 19, further comprising comparing the number of times that the voltage-droop mitigation is performed within the time duration with a second threshold number, and increasing the droop threshold if the number of times that the voltage-droop mitigation is performed within the time duration is above the second threshold number.

22. The method of claim 19, wherein monitoring voltage droop comprises detecting a timing error in a delay path caused by the voltage droop, the delay path including a tunable delay device, and wherein performing voltage-droop mitigation for the circuit if the monitored voltage droop equal to or greater than the droop threshold comprises performing voltage-droop mitigation for the circuit if the timing error is detected, and decreasing the droop threshold comprises adjusting a delay setting of the tunable delay device.

* * * * *